US007199639B2

(12) United States Patent
Kanno et al.

(10) Patent No.: US 7,199,639 B2
(45) Date of Patent: Apr. 3, 2007

(54) SEMICONDUCTOR DEVICE WITH LEVEL CONVERTER HAVING SIGNAL-LEVEL SHIFTING BLOCK AND SIGNAL-LEVEL DETERMINATION BLOCK

(75) Inventors: Yusuke Kanno, Kodaira (JP); Hiroyuki Mizuno, Musashino (JP); Takeshi Sakata, Hino (JP); Takao Watanabe, Fuchu (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/410,956

(22) Filed: Apr. 26, 2006

(65) Prior Publication Data

US 2006/0197579 A1  Sep. 7, 2006

Related U.S. Application Data

(60) Continuation of application No. 11/117,479, filed on Apr. 29, 2005, now Pat. No. 7,106,123, which is a division of application No. 10/149,189, filed on Jun. 10, 2002, now Pat. No. 6,933,765.

(30) Foreign Application Priority Data

Jan. 27, 2000  (WO) .................. PCT/JP00/00411

(51) Int. Cl.
*H03L 5/00* (2006.01)
(52) U.S. Cl. .................................. 327/333
(58) Field of Classification Search .............. 326/80, 326/81; 327/291, 293, 294, 309, 318, 319, 327/333, 390
See application file for complete search history.

(56) References Cited

U.S. PATENT DOCUMENTS 5,877,650 A    3/1999   Matsushita (Continued)

FOREIGN PATENT DOCUMENTS

JP    63-69455    9/1986

(Continued)

OTHER PUBLICATIONS

Kiyoo Itoh, "VLSI Memory Chip Design" and translation, Advanced Microelectronics, 2001, pp. 88-89.

*Primary Examiner*—Jeffrey Zweizig
(74) *Attorney, Agent, or Firm*—Reed Smith LLP; Stanley P. Fisher, Esq.; Juan Carlos A. Marquez, Esq.

(57) ABSTRACT

A semiconductor device including a level converter (LSC) is disclosed. The level converter comprises a voltage-up circuit (LSC1) that operates on low voltage of power supply (VDD) and steps up voltage enough to drive the level converter and a level converter circuit (LSC2) that operates on high voltage of power supply (VDDQ). The voltage-up circuit is capable of constantly generating 2×VDD so that the level converter can convert a low voltage of power supply (VDD) below 1 V to VDDQ. This voltage-up circuit can be configured only with MOSFET transistors produced by thin oxide film deposition, thus enabling high-speed operation. To facilitate designing a circuit for preventing a leakage current from occurring in the level converter during sleep mode of a low-voltage-driven circuit (CB1), the level converter circuit (LSC2) includes a leak protection circuit (LPC) that exerts autonomous control for leak prevention, dispensing with external control signals.

3 Claims, 22 Drawing Sheets

U.S. PATENT DOCUMENTS

| | | |
|---|---|---|
| 5,952,847 A | 9/1999 | Plants et al. |
| 6,011,421 A | 1/2000 | Jung |
| 6,043,699 A | 3/2000 | Shimizu |
| 6,064,250 A | 5/2000 | Proebsting |
| 6,798,246 B2 | 9/2004 | Chen |
| 6,842,041 B1 | 1/2005 | Om'Mani et al. |
| 6,864,736 B2 | 3/2005 | Guedon et al. |

FOREIGN PATENT DOCUMENTS

| | | |
|---|---|---|
| JP | 63-299409 | 5/1987 |
| JP | 3-273594 | 6/1990 |
| JP | 6-90161 | 9/1992 |
| JP | 11-27137 | 6/1997 |
| JP | 11-195975 | 12/1997 |

SEMICONDUCTOR DEVICE WITH LEVEL CONVERTER HAVING SIGNAL-LEVEL SHIFTING BLOCK AND SIGNAL-LEVEL DETERMINATION BLOCK

CROSS REFERENCE TO RELATED APPLICATIONS

This application is a Continuation application of U.S. application Ser. No. 11/117,479 filed Apr. 29, 2005, which is a Divisional application of U.S. Ser. No. 10/149,189 filed Jun. 10, 2002. Priority is claimed based on U.S. application Ser. No. 11/117,479 filed Apr. 29, 2005 and issued into U.S. Pat. No. 7,106,123 Sep. 12, 2006, which claims the priority date of U.S. application Ser. No. 10/149,189 filed Jun. 10, 2002 and issued into U.S. Pat. No. 6,933,765 on Aug. 23, 2005, which claims the priority date of PCT/JP00/00411 filed Jan. 27, 2000, all of which is incorporated by reference.

TECHNICAL FIELD

The present invention relates to a semiconductor device comprising circuits that operate on a low voltage power supply and circuits that operate on a high voltage power supply. In particular, the invention relates to a semiconductor device including a level converter that transmits output from a circuit operating on a low voltage power supply to a circuit operating on a high voltage power supply.

BACKGROUND ART

A conventional level converter of this kind is known as a circuit for converting signals with the amplitude of a low voltage power supply VDD to signals with the amplitude of a high voltage power supply VDDQ as disclosed in "Super LSI Memory" written by Ito Kiyoo, page 71, 1996, published by Baifukan (this level converter will be referred to as prior art 1 hereinafter). In order to apply the level converter of prior art 1 to operation on lower voltage as low voltage power supply VDD, a circuit was configured to convert input signals to those with the amplitude of a boosted voltage and further converts the signals to those with the voltage amplitude level of high voltage power supply VDDQ, which was disclosed in Kokai (Japanese Unexamined Patent Publication) No. Hei 11-27137 (No. 27137 of 1999) (This will be referred to as prior art 2 hereinafter).

FIG. 22 is a circuit diagram representing the level converter of prior art 2. This level converter is comprised of a voltage-up circuit VUC that boots the voltage of signals with the amplitude of a low supply voltage VDL, which have been input from an inside-chip circuit CB using a VDL power supply as its operating power supply, and a level converter LS2201 that is the same as the level converter of prior art 1 and converts the voltage-boosted input signals to signals with the amplitude of high supply voltage VDH. The level converter LS2201 of prior art 1 is a so-called CMOS static type and configured with p-channel MOSFETs (hereinafter referred to as PMOS transistors) P2201 and P2202 and n-channel MOSFETs (hereinafter referred to as NMOS transistors) N2201 and N2202.

Output from the voltage-up circuit VUC is received by the gates of a pair of differential input NMOS transistors N2201 and N2202 and converted to signals S2002 with the output amplitude of high supply voltage VDH level. The PMOS transistors P2201 and P2202 make loads to the differential input NMOS transistors N2201 and N2202 and they are cross connected such that the gate of one PMOS transistor is connected to the drain of the other PMOS transistor.

Higher voltage than input level VDL is applied to the gates of the NMOS transistors N2201 and N2202 and its effect is increasing the drive power of both the NMOS transistors N2201 and N2202. Therefore, the circuit shown in FIG. 22 enables operation on lower voltage VDL than in a case that the level converter of prior art 1 solely functions.

The voltage-up circuit disclosed in prior art 2 is shown in FIG. 23. This voltage-up circuit outputs a 2×VDL level, but can do temporarily. That is, a maximum of VDL level is only applied to the gates of the PMOS transistors P2301 and P2302, and therefore of the terminals of PMOS transistors P2301 and P2304 to which the capacitors C2301 and C2302 are connected change from the drain state to the source state. Consequently, the 2×VDL level cannot remain constant and drops to a voltage equaling the power supply voltage VDL plus the PMOS transistor threshold voltage.

Accordingly, if the power supply voltage VDL is, for example, as low as 1 V or below, it is not enough to drive the level converter of prior art 1. Voltage to be applied to some of the MOS transistors used as the components of the circuit shown in FIG. 23 will reach a maximum of 2×VDL for a moment. Thus, low voltage tolerant MOS transistor devices produced by thin oxide film deposition are difficult to use and it is necessary to fabricate an integrated circuit with high voltage tolerant MOS transistor devices produced by thick oxide film deposition. This may result in difficulty in increasing the operating speed of the IC.

A single voltage-up circuit example was disclosed in Kokai (Japanese Unexamined Patent Publication) No. Sho 63-69455 (No. 69455 of 1988). This circuit example gives a 2×VCC−VT level (VCC: power supply voltage, VT: threshold voltage of an NMOS transistor). Furthermore, another voltage-up circuit configuration was disclosed in Kokai (Japanese Unexamined Patent Publication) No. Hei 3-273594 (No. 273594 of 1991). This circuit gives a 2×VL level by using a voltage-up circuit giving 2×VL−VT (VL: low voltage) and a voltage tripler.

Even if the former disclosed voltage-up circuit that increases voltage to a 2×VCC−VT level is used as the voltage-up circuit in the circuit implementation of prior art 2, very low power supply voltage VDL may cause the level converter of prior art 1 to be inoperative.

When the voltage-up circuit configuration giving a 2×VL level disclosed in Kokai No. Hei 3-273594 is used, MOS transistors produced by thicker oxide film deposition must be used to implement the voltage tripler. Due to the increased number of the MOS transistors, increase of mounting area is inevitable and results in high cost.

A single level converter example was disclosed in Kokai (Japanese Unexamined Patent Publication) No. Sho 63-299409 (No. 299409 of 1988) (This will be referred to as prior art 3 hereinafter). This level converter carries out level conversion, taking advantage of a signal with its level shifted from the level of an input signal. For level shifting, a resistor and MOS transistors are used. FIG. 24 shows the level converter disclosed in prior art 3. This circuit carries out level conversion, taking advantage of potential down to which voltage is dropped by a resistor R2401. Consequently, for example, if voltage VIN at the gate pin of an NMOS transistor N2405 is equal to voltage VDD at the gate pin of an NMOS transistor N2404, that is, VIN=VDD, current always flows from a high potential pin VDDQ to a low potential pin VSSQ. This is not desirable from the point of view of reducing power consumption that is very important for a low-voltage circuit.

While the previous implementation examples of level converter and voltage-up circuit were discussed above, another problem of the level converter should be considered as will be described below. This problem is a leakage current that occurs in a logic circuit driven by high voltage power supply VDDQ when a circuit block that uses the low voltage power supply VDD as its power supply, connected to the level converter, is powered off. As a protection circuit for preventing this leakage current, a level converter with fixed output in which output to the high voltage side is fixed to the voltage of high voltage power supply VDDQ by external signal input was disclosed in Kokai (Japanese Unexamined Patent Publication) No. Hei 11-195975 (No. 195975 of 1999). This circuit is effective, but it is ideal that a leak protection circuit prevents leaks by autonomous control dispensing with external control signals and such circuit is desirable in view of simplifying design.

In the light of recent trend of IC technology toward reducing power consumption, lowering the power supply voltage of low-voltage logic circuits down to below 1 V is actively pursued. On the other hand, however, as high voltage as 3.3 V or 2.5 V is still required for components driven by high voltage, such as, typically, I/O circuits and word-line driving circuits of a dynamic random access memory (DRAM). Thus, attention must be paid to the following two points.

1. Difference between the power supply voltage of low-voltage logic circuits and that of high-voltage logic circuits becomes great.

2. If the level (for example, 0.7 V) of the low-voltage-side circuit operation (low voltage power supply VDD) becomes as low as the threshold voltage (VTH, for example, 0.7 V) of high-voltage-side circuit operation (high voltage power supply VDDQ, for example, 3.3 V), the low voltage power supply VDD level is too low to drive the level converter.

These problems place limitations on the operation of previous level converters. Because the voltage-up circuit disclosed in Kokai No. Hei 11-27137 gives a 2×VDD level, but does only for a moment as described above, it may be difficult to operate the level converter when the low voltage power supply VDD is very low below 1 V. In addition, voltage to be applied to low-voltage circuits reaches a maximum of 2×VDD, and therefore, MOS transistors of low-voltage circuits must be produced by thick oxide film deposition, consequently bottlenecking high-speed operation.

In connection with the voltage-up circuit, the previous implementation example of level converter (Kokai No. Hei 3-273594) outputs a 2×VDD level. However, the voltage tripler is added to this implementation to give a 2×VDD level and this posed the problems: MOS transistors produced by thicker oxide film deposition are required; the increased number of components; and, consequently, increase of mounting area.

As discussed in Kokai No. Hei 11-195975, when the low-voltage-side power supply is off, a leakage current occurs in the following stage of high-voltage-side circuits; this leakage current problem will be described in detail in a later section regarding the preferred embodiments of the invention. According to the above Kokai publication, external control signals are used to inhibit the leakage current. However, if the level converter can be configured to autonomously control the leakage current, simpler circuit design and reduced cost can be achieved.

An object of the present invention is to provide a semiconductor device comprising a high-voltage-driven circuit operating on a high voltage of power supply, a low-voltage-driven circuit operating on a low voltage of power supply, and a level converter for converting the signal level of the Low-voltage-driven circuit to the signal level of the high-voltage-driven circuit, wherein the level converter operates even when the low voltage power supply supplies a voltage of below 1 V.

Another object of the present invention is to provide a semiconductor device further including a circuit for preventing a leakage current from occurring in the level converter when the above low-voltage-driven circuit is placed in sleep mode.

DISCLOSURE OF INVENTION

The above-described problems exist when a level converter is configured if the low-voltage-side power supply voltage VDD is below 1 V and cannot be avoided by combining any voltage-up circuit disclosed heretofore and the level converter of prior art 1. These problems can be solved by configuring the level converter as follows.

A voltage doubler giving a constant 2×VDD level is used so that the level converter can operate even when the voltage of the low voltage power supply VDD is below 1 V.

The voltage doubler circuit is constructed in such a manner that it can be configured with only MOS transistors whose gates are made by thin oxide film, thus enabling high-speed operation.

To facilitate designing a circuit for preventing a leakage current from occurring when the circuit block supplied with voltage from the low voltage power supply is placed in sleep mode, a leak protection circuit is provided for internal and autonomous control of the leak, dispensing with external control signals.

As the gist of the present invention, a primary implementation typical of the invention disclosed herein will be described below. A semiconductor device that is provided in accordance with the present invention is a semiconductor device comprising a first circuit which operates on a first voltage (VDD) of power supply and outputs a first signal with the amplitude of the first voltage of power supply; a second circuit which operates a second voltage (VDDQ) of power supply higher than the first voltage of power supply; and a level converter which operates on the first and second voltages of power supply, converts the first signal to a second signal with the amplitude of the second voltage of power supply, and outputs the second signal to the second circuit. The level converter comprises a voltage-up circuit which operates on the first voltage of power supply and steps up the amplitude of the first signal, a level converter circuit which operates on the second voltage of power supply and converts a signal output from the voltage-up circuit to a signal with the amplitude of the second voltage of power supply, and means for holding a voltage level output from the level converter circuit.

BRIEF DESCRIPTION OF DRAWINGS

FIG. 4 is a circuit diagram illustrating one embodiment of the leak protection circuit using exclusive OR.

FIG. 6 shows voltage waveforms when power supply is controlled by the leak protection circuit using exclusive OR.

FIG. 7 is a circuit diagram illustrating another embodiment of the leak protection circuit using exclusive OR.

FIG. 8 is a circuit diagram illustrating still another embodiment of the leak protection circuit using exclusive OR.

FIG. 9 is a circuit diagram illustrating yet another embodiment of the leak protection circuit using exclusive OR.

BEST MODE FOR CARRYING OUT THE INVENTION

<Embodiment 1>

Figure 1:
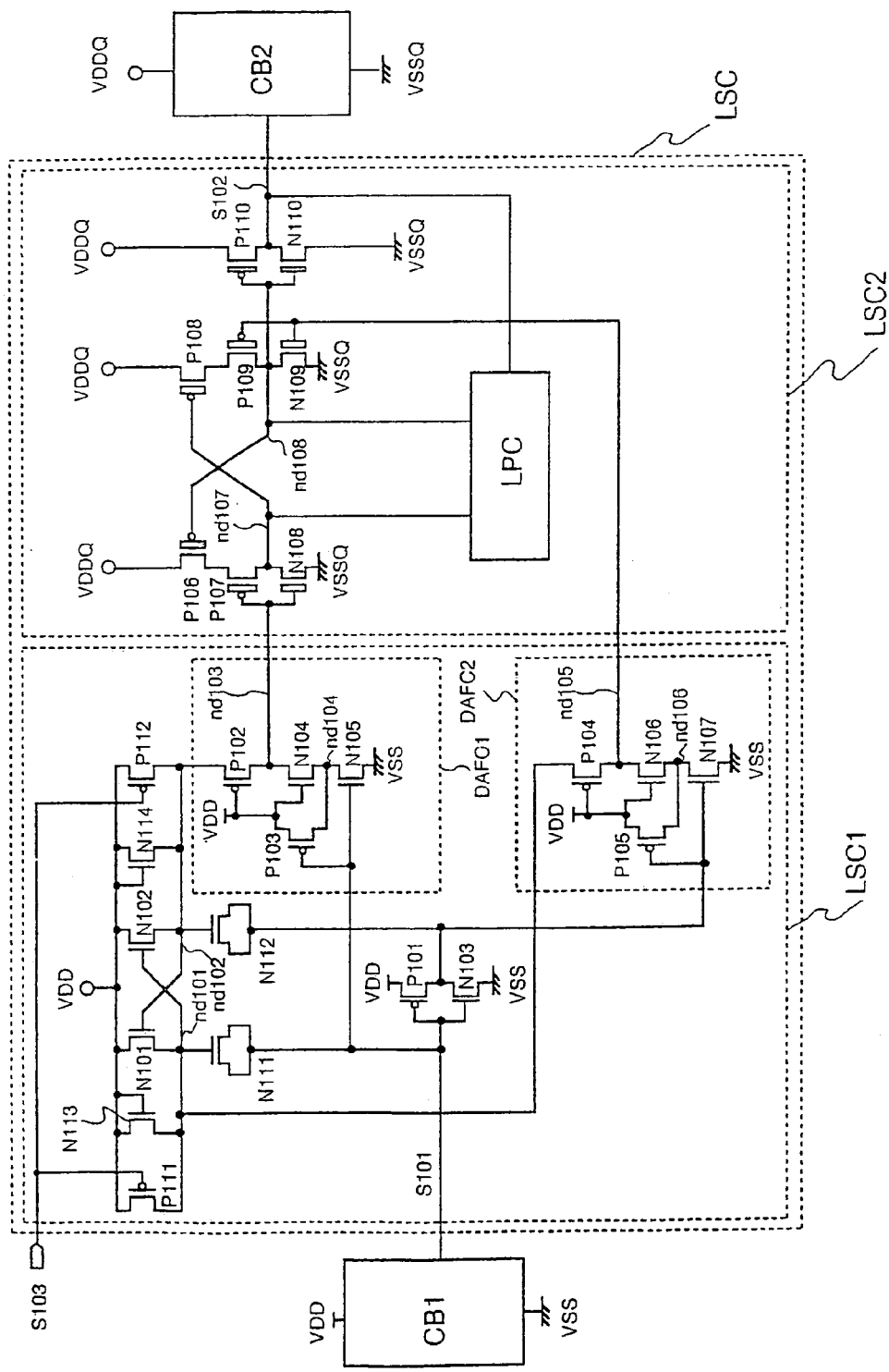
FIG. 1 is a circuit diagram illustrating a level converter in accordance with one preferred embodiment of the invention, which includes a voltage doubler and a leak protection circuit.

FIG. 1 shows a semiconductor device in accordance with one preferred embodiment of the present invention. The semiconductor device shown in FIG. 1 is formed on a semiconductor substrate by using a CMOS integration technology. A level converter LSC is located between a low-voltage logic circuit CB1 which is driven by first power supply voltage VDD (for example, 0.7 V) and a high-voltage logic circuit CB2 which is driven by second power supply voltage VDDQ (for example, 3.3 V) relatively higher than the first supply voltage. The level converter LSC is comprised of a voltage-up circuit LSC1 which is powered by the first power supply voltage VDD and a circuit LSC2 which is powered by the second power supply voltage VDDQ. In this preferred embodiment, a voltage doubler is included in the LSC1 circuit.

Here, reference symbols VSS and VSSQ denote ground potential opposite to the VDD and VDDQ power supply voltages, respectively, and VSS and VSSQ are normally 0 V. Among MOS transistors represented symbolically in FIG. 1, those with a gate represented by a vertical bar are low voltage tolerant ones (PMOS and NMOS) and those with a gate represented by a rectangular object are high voltage tolerant ones (PMOS and NMOS). This representation applies to the drawings of other preferred embodiments which will be described later.

In FIG. 1, one exemplary signal S101 is output from the low-voltage logic circuit CB1. The S101 signal is to be input to the high-voltage logic circuit CB2. The amplitude of the S101 logic signal ranges from ground voltage VSS to power supply voltage VDD. For example, its low (Lo) level is 0 V (VSS) and high (Hi) level is the power supply voltage VDD. An inverter consisting of a PMOS transistor P101 and an NMOS transistor N103 converts the input signal S101 to its complementary signal. The amplitude of the complementary signal ranges from the ground potential VSS to the power supply voltage VDD.

The voltage-up circuit LSC1 converts the Hi level (VDD) of the signal S101 and its complementary signal to a higher level that is double the power supply voltage VDD (this level will be referred to as 2×VDD hereinafter) by letting the above signals pass through a capacitor that is formed by, for example, the short-circuited source and drain electrodes and gate electrodes of NMOS transistors N111 and N112. To the gates of the capacitor, NMOS transistors N101 and N102 are connected. These NMOS transistors are cross coupled; that is, the gate of the NMOS transistor N101 and the drain of the N102 transistor are connected and the gate of the N102 transistor and the drain of the N101 transistor are connected. The sources of the MOS transistors N101 and N102 are connected to power supply voltage VDD. In this configuration, when the level of the signal S101 is ground potential VSS, the MOS transistor N101 turns off and because of coupling with the N112 transistor of the capacitor, a node nd102 is set at 2×VDD. When the N101 turns on, a node nd101 is set at power supply voltage VDD.

Inversely, when the signal S101 level is power supply voltage VDD, the MOS transistor N102 turns off and because of coupling with the N111 transistor of the capacitor, the voltage at the node nd101 is boosted up to 2×VDD. When the MOS transistor N102 turns on, the node nd102 is set at power supply voltage VDD.

Figure 2:
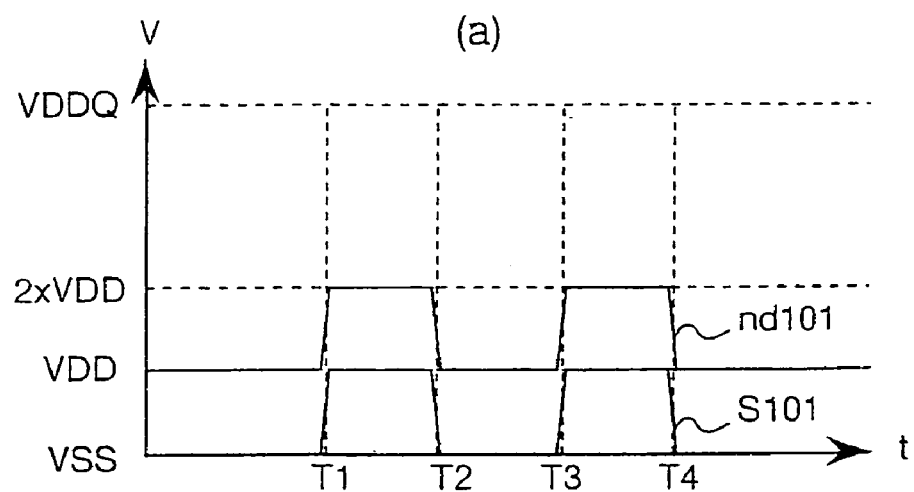
FIG. 2 shows voltage waveforms explaining potential transition at the nodes in the level converter of FIG. 1.
Figure 2:
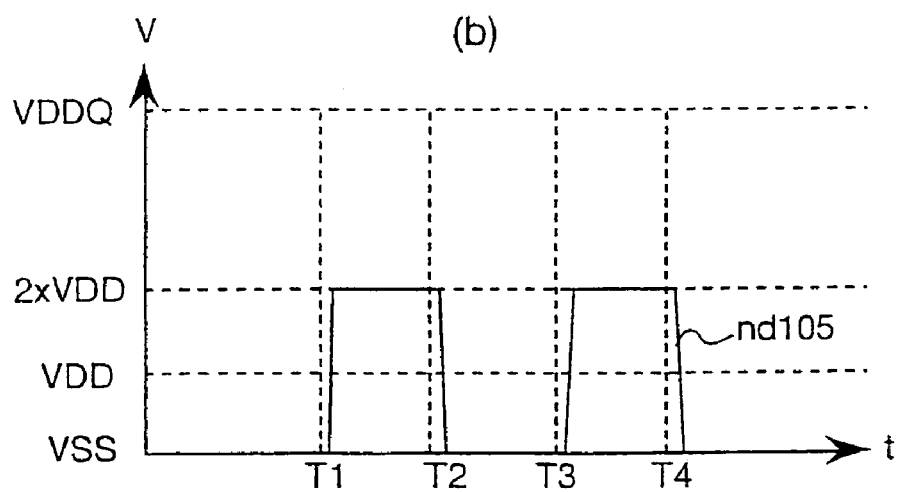
Figure 2:
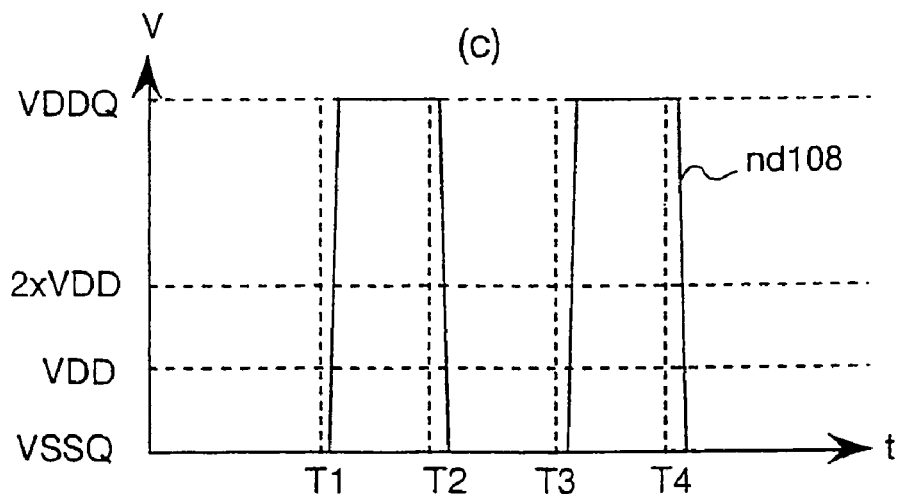

How the signal voltage amplitude changes is shown in FIG. 2(a). In FIG. 2(a), the waveform of the signal S101 and its waveform at the node nd101 are shown. The waveform of the complementary signal to the S101 signal and its waveform at the node nd102 are opposite in phase to the waveforms shown in FIG. 2(a). Now, the maximum voltages to be applied to the MOS transistors will be described below.

For both the MOS transistors N101 and N102, either their source and gate are at power supply voltage VDD with drain being at 2×VDD or their source and drain are at VDD with gate being at 2×VDD, and therefore the maximum voltage to be applied to them is VDD. For the MOS transistors N111 and N112 used for the capacitor, either their source and drain are at 0 V with gate being at VDD or their source and drain are at VDD with gate being at 2×VDD, and therefore the maximum voltage to be applied to them is VDD.

At this stage, the amplitude of the voltages at the nodes nd101 and nd102 is still the same as the amplitude between the ground potential VSS and the power supply voltage VDD. It is thus necessary to convert the voltage amplitude to the amplitude between the VSS and 2×Vdd. To accomplish this, double-amplitude forming circuits DAFC1 and DAFC 2 shown in FIG. 1 are provided. Because the double-amplitude forming circuits DAFC1 and DAFC 2 are identical ones, only the double-amplitude forming circuit DAFC1 will be explained by way of illustration. The DAFC1 circuit is comprised of PMOS transistors P102 and P013 and NMOS transistors N104 and N105. The MOS transistors P103 and N105 form an inverter wherein the signal S101 is input to their gates. The output of the inverter is connected to the source of the MOS transistor N104 with its gate fixed to power supply voltage VDD. The node nd 102 is connected to the source of the MOS transistor P102 with its gate fixed to power supply voltage VDD. The drain of the MOS transistor P102 and the drain of the N104 transistor join and connect to a node nd103.

Inputs to the DAFC 1 circuit are the signal S101 output from the low-voltage logic circuit CB1 and the potential existing at the node nd102. Possible combination is either the signal S101 level of VSS and potential of 2×VDD at the node nd102 or the signal S101 level of VDD and potential of VDD at the node nd102.

In the former case, the potential at the source of the MOS transistor P102 becomes 2×VDD and its gate is fixed to power supply voltage VDD, and therefore, the MOS transistor P102 turns on and the potential at the node nd103 becomes 2×VDD. At this time, because the gates of the MOS transistors P103 and N105 to which the signal S101 is input are at ground potential VSS, the MOS transistor P103 turns on, while the MOS transistor N105 turns off. In consequence, the potential at a node nd104 becomes VDD. Now that the node nd103 is at 2×VDD, the MOS transistor N104 turns off.

In the latter case, the potential at the source of the MOS transistor P102 becomes VDD and its gate is fixed to power supply voltage VDD, and therefore, the MOS transistor P102 turns off. At this time, the potential at the gates of the MOS transistors P103 and N105 to which the signal S101 is input becomes VDD, the MOS transistor P103 turns off, and the N105 transistor turns on. Inconsequence, the potential at the node nd104 becomes ground potential VSS, and therefore, the potential at the node nd103 also becomes VSS. Thus, the node nd103 comes to be at ground potential VSS. The signal waveform at the node nd103 (or nd105) is shown in FIG. 2(b). As shown, the signal comes to have the amplitude between the ground potential VSS and 2×VDD.

Now, consider the voltages to be applied to the MOS transistors when the potential of the signal S101 is ground level VSS and the potential at the node nd102 is 2×VDD. For the MOS transistor P102, its gate is at VDD, while its source and drain are at 2×VDD, and the maximum voltage to be applied to it is VDD. For the MOS transistor P103, its gate is at VSS, while its source and drain are at VDD, and the maximum voltage to be applied to it is VDD. For the MOS transistor N104, its gate and source are at VDD, while its drain at 2×VDD, and the maximum voltage to be applied to it is VDD. For the MOS transistor N105, its gate and source are at VSS, while its drain is at VDD, and therefore, the maximum voltage to be applied to it is VDD.

When the signal S101 level is VDD and the potential at the node nd102 is VDD, for the MOS transistor P102, its gate and source are at VDD, while its drain is at VSS, and therefore, the maximum voltage to be applied to it is VDD. For the MOS transistor P103, its gate and source are at VDD, while its drain is at VSS, and the maximum voltage to be applied to it is VDD. For the MOS transistor N104, its gate is at VDD, while its source and drain are at VSS, and therefore, the maximum voltage to be applied to it is VDD. For the MOS transistor N105, its gate is at VDD, while its source and drain are at VSS, and therefore, the maximum voltage to be applied to it is VDD.

The double-amplitude forming circuit DAFC1 can generate voltages in the amplitude between VSS and 2×VDD at the output node nd 103. In spite of generating the maximum voltage of 2×VDD, it can restrict the maximum voltage to be applied to the MOS transistors to VDD. The double-amplitude forming circuit DAFC2 of the same configuration outputs voltages at its output node nd105 in the opposite-phase amplitude to the amplitude of the voltages at the node nd 103. Its essential operation is the same as the above-described DAFC1 circuit.

The voltage-up circuit essentially operates as described above, and in this relation, initializing the nodes nd101 and 102 will be explained below. In order to drive the voltage-up circuit LSC1, the node nd101 and nd102 must be charged at power supply voltage VDD beforehand. For this purpose, using pull-up NMOS transistors N113 and N114, it is necessary to set the potential at the nodes nd101 and nd102 at VDD less VTHN (VTHN: threshold voltage of NMOS transistor). However, when the low power supply voltage becomes below 1 V, the voltage-up circuit becomes hard to operate even with the charge level of VDD less VTHN. In that event, better embodiment would be to set the potential at the nodes nd101 and nd102 at power supply voltage VDD, using PMOS transistors P111 and P112. A signal S103 is used as a control signal for initializing the nodes nd101 and nd102 by using the MOS transistors P111 and P112 and the nodes nd101 and nd102 can be charged at VDD level for sure operation of voltage-up. These MOS transistors P111 and P112 may be designed to be high voltage tolerant. This is effective when the level converter initializing signal is controlled at high voltage level (signal having the amplitude between VSSQ and VDDQ).

Then, the converter circuit LSC2 that receives each output signal from the nodes nd103 and nd105 of the voltage-up circuit LSC1 and converts the signal to a signal S102 having the amplitude of power supply voltage VDDQ will be described. The output voltage from the nodes nd103 and nd105 of the voltage-up circuit is input to the converter circuit LSC2 and then input to the gates of a pair of differential input NMOS transistors N108 and N109 within the LSC2. The converter circuit LSC2 includes PMOS transistors P106 and P108 that make loads to the differential input NMOS transistors N108 and N109 and PMOS transistors P107 and P109 for tolerance to voltage and relaxation. The PMOS transistors P106 and P107 are connected in series and the P108 and P109 transistors are also connected in series. For the PMOS transistor P106, its source is connected to power supply voltage VDDQ, its gate is connected to the drain of the P109 transistor, and its drain is connected to the source of the P107 transistor. For the PMOS transistor P107, its source is connected to the drain of the P106 transistor, its gate is connected to the node nd103, and its drain is connected to the drain of the N108 transistor. For the PMOS transistor P108, its source is connected to power supply voltage VDDQ, its gate is connected to the drain of the P107 transistor, and its drain is connected to the source of the P109 transistor. For the PMOS transistor P109, its source is connected to the drain of the P108 transistor, its gate is connected to the node nd105, and its drain is connected to the drain of the N109 transistor. Therefore, the PMOS transistors P106 and P106 are cross connected. The output of this level converter circuit is gained at a node nd108, input to an inverter consisting of a PMOS transistor P110 and an NMOS transistor N110 in the following stage, and further input to the high-voltage logic circuit CB2 that follows the LSC2. The waveform of the output signal at the node nd108, which is shown in FIG. 2(c), has the amplitude between ground potential VSSQ and power supply voltage VDDQ.

Even if the power supply voltage for the low-voltage logic circuit is significantly low and equivalent to the threshold voltage of the MOS transistor of high-voltage logic circuit, level conversion is performed after the low power supply voltage is doubled in the above-described manner according to the present invention, and therefore, the operation of the level converter can be assured. Because the maximum voltage to be applied to all MOS transistors shown in FIG. 1 that constitute the voltage-up circuit LSC1 is VDD, a high-speed device can be designed with all gates made by thin oxide film deposition. This enables high-speed level conversion as a feature of the invention.

Figure 3:
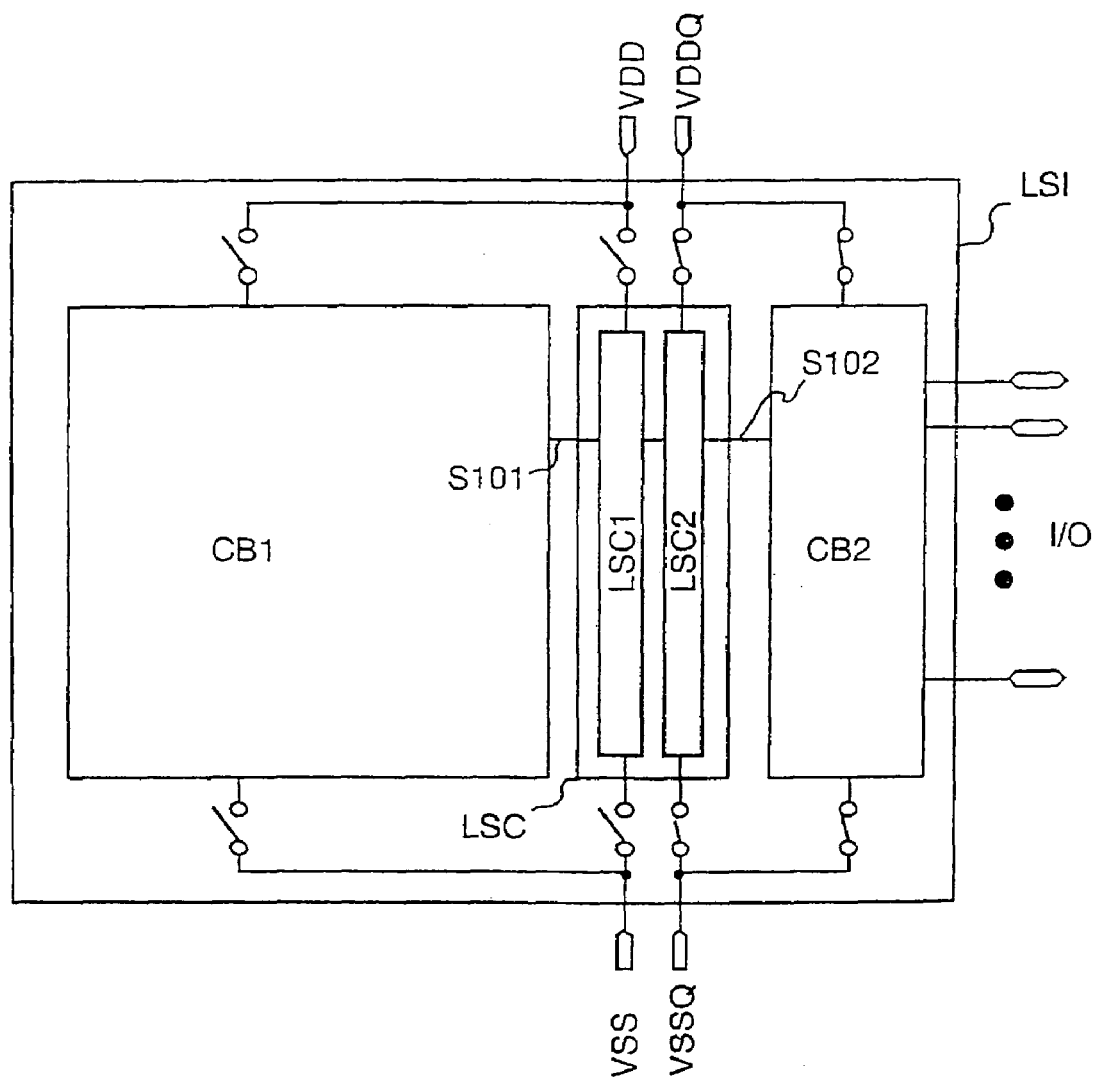
FIG. 3 shows an illustrative configuration of LSI, part of which can be placed in sleep mode.

Meanwhile, the thus embodied level converter is a latch-type level converter and it is necessary for this type of level converter to prevent a leakage current from occurring when the power supply for the low-voltage logic circuit CB1 is off. Mode in which some on-chip circuit is placed in the power-off state is herein referred to as sleep mode. FIG. 3 shows an illustrative LSI configuration that we analyzed before incorporating the present invention in it, which is provided to explain the sleep mode. On the LSI chip shown in FIG. 3, a logic circuit CB1 which is driven by power supply voltage VDD and an I/O interface circuit CB2 which is driven by power supply voltage VDDQ are found with a level converter located therebetween. Examples of such LSI supplied with two different voltages of power supply include a real time clock circuit and a DRAM word-line boosting circuit as well as an I/O circuit. In such LSI, for reducing power consumption, it is effective to control the power supply to the logic circuit CB1 to turn it off when the logic circuit CB1 is not in use. However, because the I/O interface circuit CB2 must continue to interface with peripheral LSIs, the power supply to it cannot be turned off.

The level converter LSI is comprised of a circuit LSC1 which is supplied with voltage from the low voltage power supply VDD and a circuit LSC2 which is supplied with voltage from the high voltage power supply VDDQ. In this circuitry, the following may occur. When the power supply for the logic circuit CB1 is turned off, the power supply for the circuit LSC1 is also turned off. At this time, application of the voltage from the high voltage power supply VDDQ to the circuit LSC2 continues.

Figure 5:
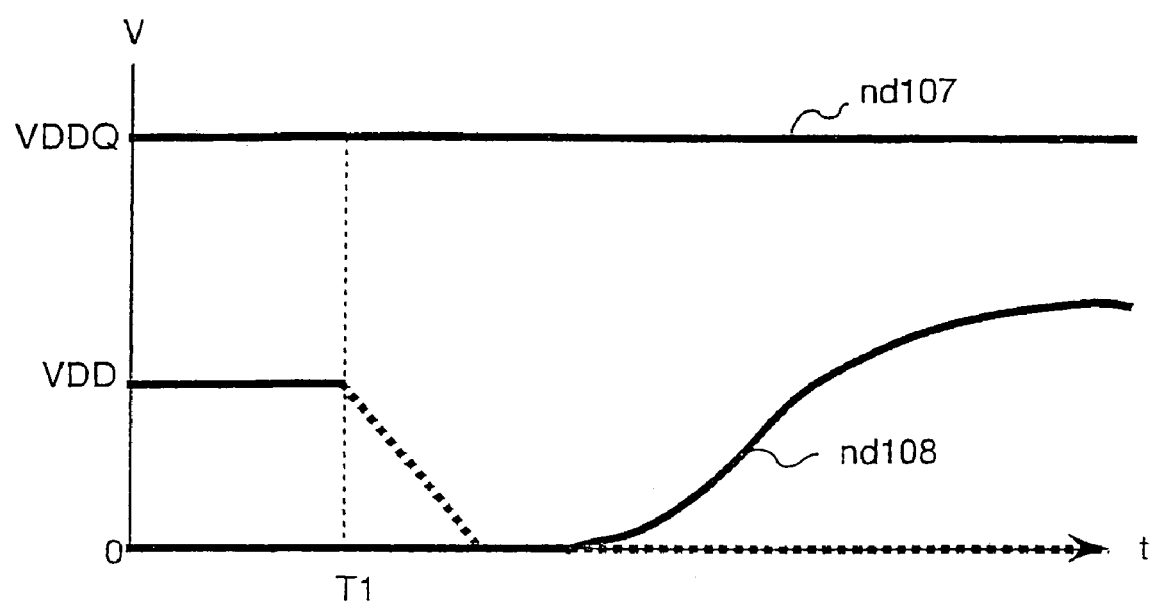
FIG. 5 shows voltage transition when a leak occurs during sleep mode.

When the latch-type level converter shown in FIG. 1 is used in such system, FIG. 5 shows how the power supply voltages VDD and VDDQ will be at the latch nodes nd107 and nd108. Assume that, in the initial state, the node nd 107 is at high voltage power supply level VDDQ and the node nd108 is at ground level 0 V. When the low voltage power supply VDD is turned off at time T1, the potential of the power supply line connected to the VDD gradually drops as indicated by a dashed line and down to the ground level 1V. At this time, the MOS transistor N109 changes from the on state to the off state, and therefore, both the MOS transistors P108 and N109 are set off. Consequently, the node nd108 becomes unable to hold the ground level 0 V which was initially held by it because of a leakage current flowing across the MOS transistors P108 and N109. The potential of the node nd108 rises up to the same level as the logic threshold voltage of the high-voltage-side MOS transistors. In consequence, a penetrating current flows through the inverter consisting of the MOS transistors P110 and N110.

A primary solution to the leakage current problem is to attach a leak protection circuit LPC to the nodes nd107 and nd108 in the level converter LSC. This leak protection circuit LPC latches potential levels at the nodes nd107 and nd108 and ensures that the nodes are set at the latched determinate levels.

Figure 4:
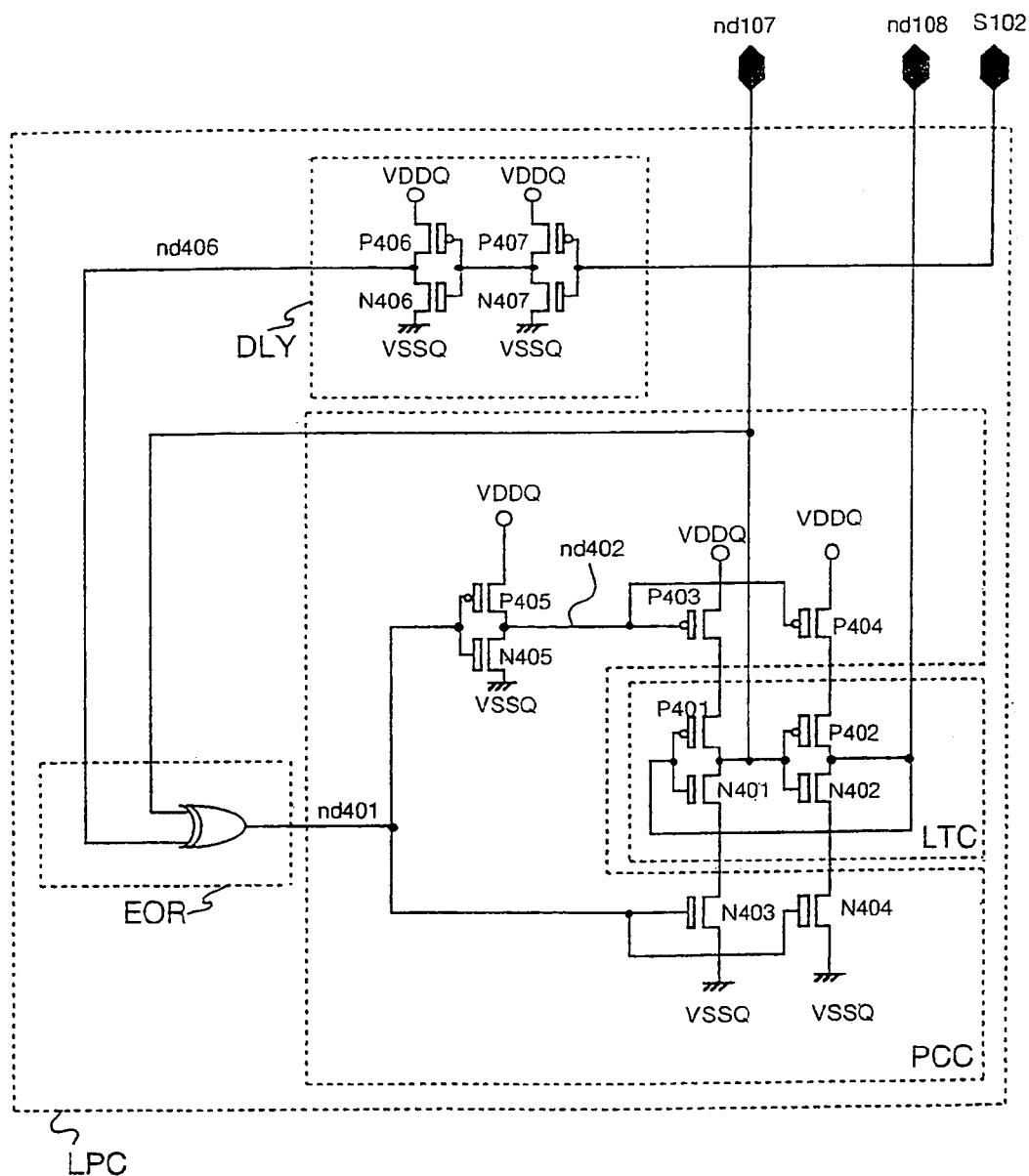

FIG. 4 is a circuit diagram illustrating one embodiment of the above leak protection circuit LPC. The LPC circuit includes a latch LTC in which the output of one inverter consisting of a PMOS transistor P401 and an NMOS transistor N401 is connected to the node nd107 and the output of another inverter consisting of a PMOS transistor P402 and an NMOS transistor N402 is connected to the node nd108. Power supply to the latch LTC is controlled by a power control circuit PCC. The power control circuit PCC is controlled by a signal output from an exclusive OR circuit EOR to which the signal S102 output from the level converter circuit LSC2 and the signal from the node nd107 are input. The power control circuit PCC is used to reduce the current for driving the latch connected to the nodes nd107 and nd108, so that the level conversion speed will not decrease.

In addition, a delay circuit DLY is used to adjust the time to control. For example, as shown, the DLY circuit is formed by a buffer consisting of PMOS transistors P406 and P407 and NMOS transistors N406 and N407. The buffer is composed of an even number of inverters and the number of inverter stages should be set at an optimum number by design.

Figure 6:
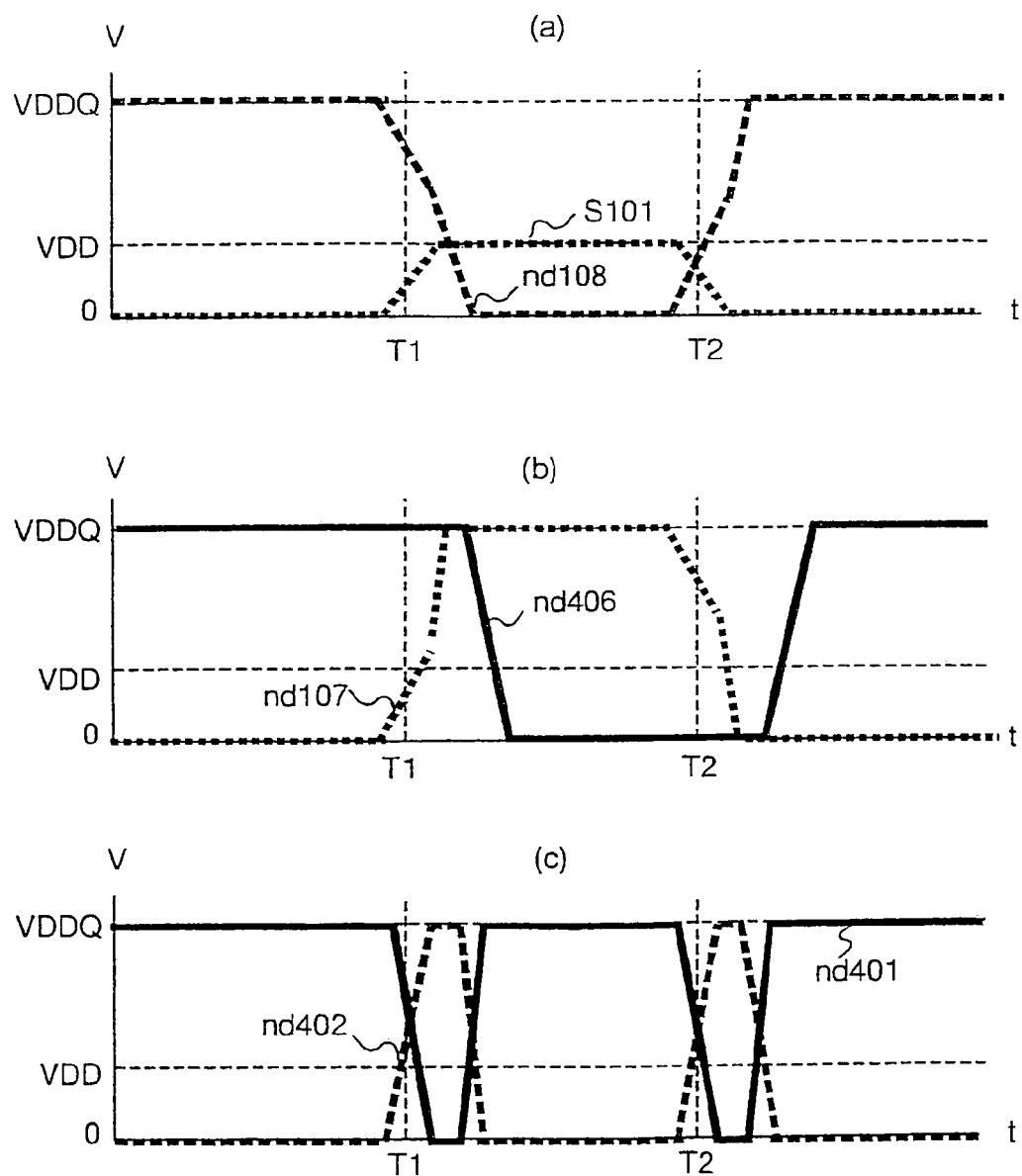

FIG. 6 shows voltage waveforms explaining the operation of the leak protection circuit LPC. FIG. 6(a) shows the waveform of the signal S101 input from the low-voltage logic circuit CB1 and the waveform of voltage at the nd108 node. FIG. 6(b) shows the waveforms of respective voltages at the nd106 and nd406 nodes. FIG. 6(c) shows the waveforms of respective voltages at the nd401 and nd402 nodes. When the input signal S101 changes to Hi level at timing of time T1, inversion starts to occur at the nd107b and nd108 nodes. At this time, a delayed signal generated from the output signal S102 appears at the nd 406, keeping the voltage level of the output signal. Then, the voltage at the output node nd401 of the exclusive OR circuit EOR to which the signal from the node nd107 and the signal from the node nd406 are input drops toward the ground level VSS. Thus, the voltage at the node nd401 starts to drop to ground potential VSSQ, whereas the voltage at the node nd402 starts to rise to power supply voltage VDDQ, which exerts control to check the current through the latch LTC. Checking the current through the latch LTC accelerates the inversion at the nd107 and nd108 nodes, and eventually, the nodes are set at the extreme determinate voltages (VDDQ at the node nd107 and VSSQ at the node nd108). When the node nd108 is set at potential VSSQ, the voltage level at the node nd108 is transmitted to the node nd406 after a certain time of delay and the node nd406 comes to be at voltage in the opposite phase to the voltage at the node nd107. The output node nd401 of the exclusive OR circuit EOR comes to be at power supply voltage VDDQ level. Consequently, the power supply to the latch LTC is completely turned on and the voltage levels at the nd107 and nd108 nodes are latched by the latch LTC. When the input signal S101 changes to Lo level at timing of time T2, the same procedure as described above is carried out, except that ground potential VSSQ is replaced with power supply voltage VDDQ and vice versa.

The level converter including the voltage doubler and the leak protection circuit is configured in this way. The level converter enables high-speed level conversion adaptive to a very low voltage of low-voltage power supply VDD and is able to prevent a leak from occurring when the low-voltage logic circuit is placed in the sleep state. Thus, the invention can realize a semiconductor device provided with a level converter that operates at high speed with reduced power consumption.

If the described level converter is used, located between a logic circuit operating on the low voltage power supply and an I/O circuit operating on the high voltage power supply, it is preferable, but not restrictive that the I/O circuit is configured with high voltage tolerant MOS transistors produced by thick oxide film deposition and the logic circuit is configured with low voltage tolerant MOS transistors produced by thin oxide film deposition. Advantage hereof is the process cost as much as the cost of producing conventionally used transistors with the gates of two types that are different in oxide film thickness.

<Embodiment 2>

Figure 7:
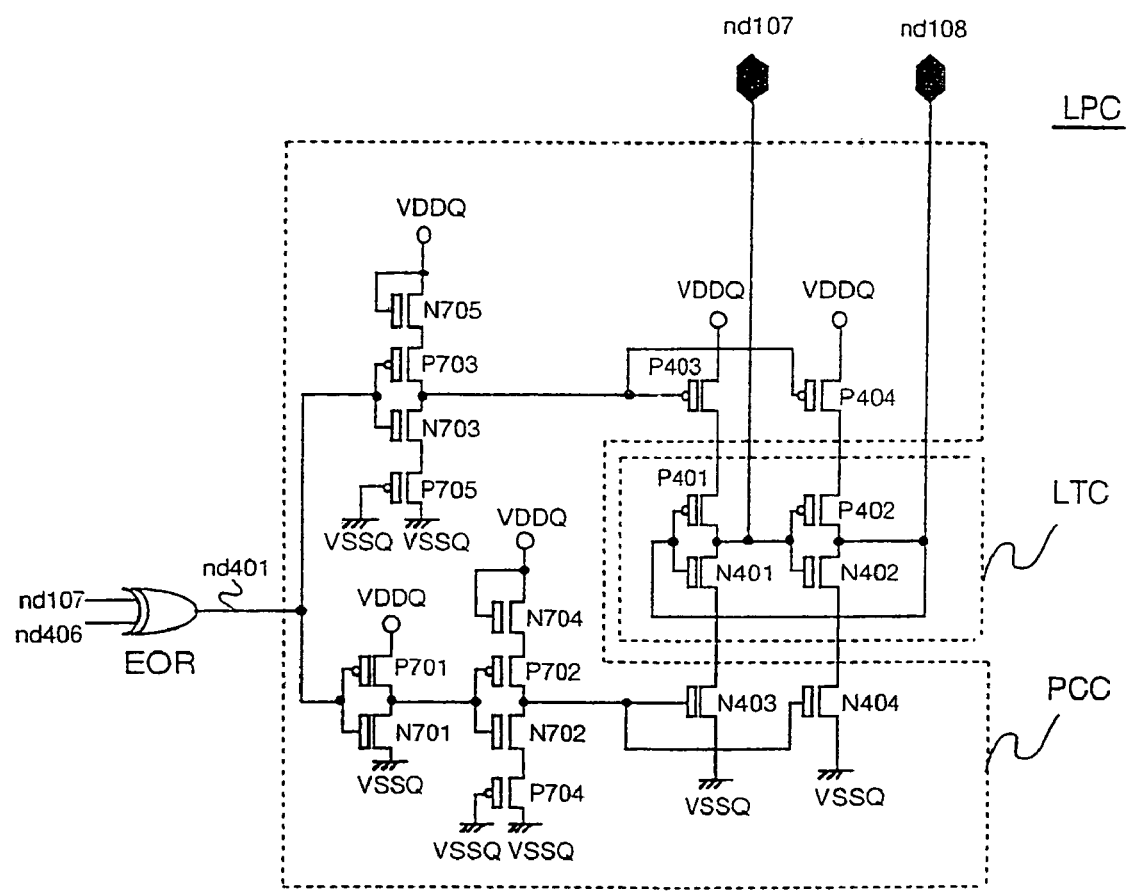

FIG. 7 is a circuit diagram illustrating another embodiment of the leak protection circuit LPC in Embodiment 1, which depicts the elements of the LPC, wherein the configuration of the power control circuit PCC is different from that shown in FIG. 4. That is, the exclusive OR circuit EOR connected to the nodes nd401, nd017, and nd108, the latch LTC, and the power control circuit PCC are extracted in FIG. 7.

Embodiment 2 differs from the embodiment shown in FIG. 4 in the configuration of the circuit for driving the gates of the MOS transistors connected to the power supplies of the latch LTC. That is, Embodiment 2 is characterized in that an inverter supplied with voltage from a low voltage power supply is connected to the gates of the PMOS transistors P403 and P404 and the NMOS transistors N403 and N404. In the inverter (consisting of a PMOS transistor P703 and an NMOS transistor N703) connected to the PMOS transistors P403 and P404, to the source of the PMOS transistor P703, a diode junction NMOS transistor N705 whose gate and drain are short-circuited is connected. To the source of the other NMOS transistor N703, a diode junction PMOS transistor P705 whose gate and drain are short circuited is connected. This inverter configuration takes advantage of the effect of what is known as "power supply voltage less threshold voltage."

Another inverter consisting of a PMOS transistor P701 and an NMOS transistor N701 is used to give logic consistency. In the LPC configuration of Embodiment 2, although the MOS transistors P403, P404, N403, and N404 cannot be turned off completely, the current flow through the latch LTC can be restricted to a low value. Accordingly, Embodiment 2 has the merit of preventing the level conversion speed from decreasing because the load on the latch LTC in response to the level converter becomes smaller. Even if the MOS transistors P403, P404, N403, and N404 are not turned off completely, logic is determinate in the internal latch LTC and therefore no penetrating current flows through the latch when the voltage levels are latched, except during transition.

While, in FIG. 7, each of the MOS transistors P403, P404, N403, and N404 for power control, which are connected to the latch LTC, is connected to each source of the inverters constituting the latch, it is possible to assemble the P403 and P404 transistors into one PMOS transistor and the N403 and N404 transistors into one NMOS transistor in configuration.

For the MOS transistors N704, N705, P704, and P705 which are respectively connected to each source of the MOS transistors P702, P703, N702, and N703, similarly, it is possible to assemble the N704 and N705 into one NMOS transistor and the P704 and P705 transistors into one PMOS transistor in arrangement. This benefit is reduced layout area.

<Embodiment 3>

Figure 8:
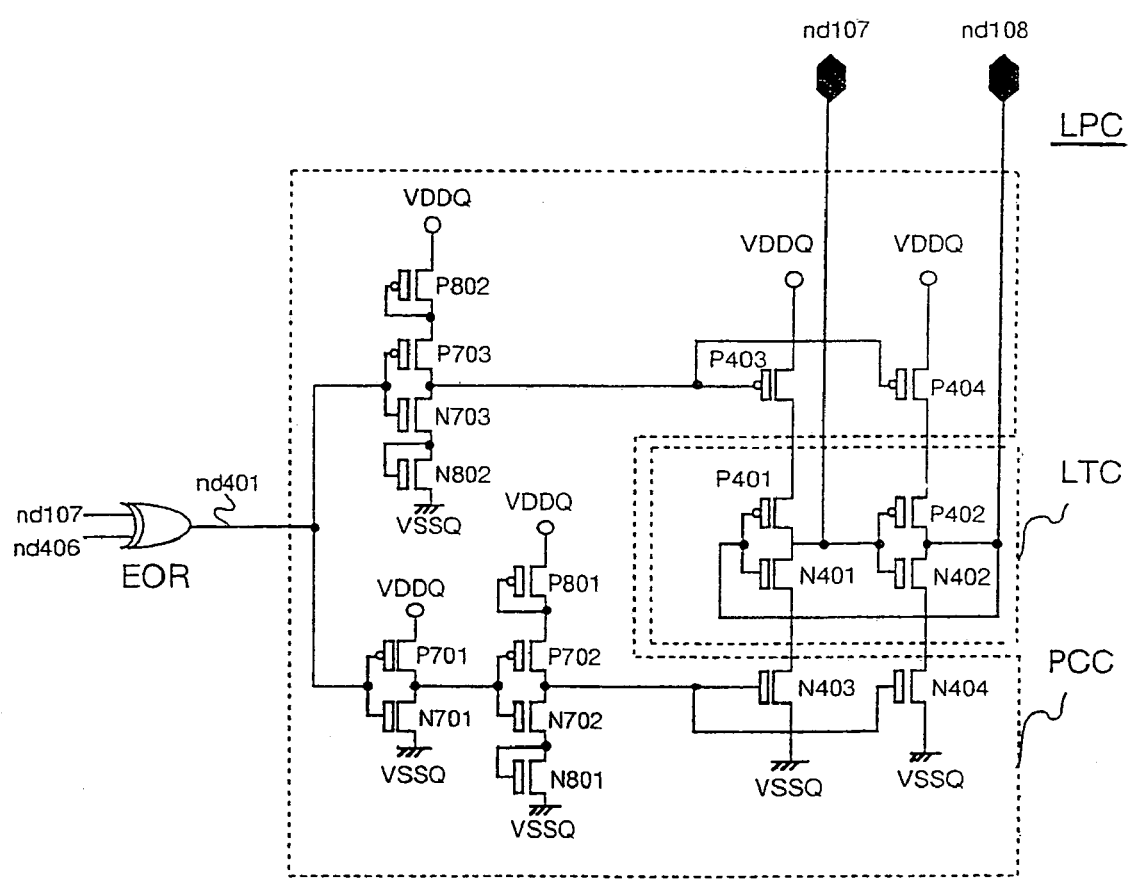

FIG. 8 is a circuit diagram illustrating another embodiment of the leak protection circuit LPC of Embodiment 2, which depicts the elements of the LPC, wherein the configuration of the power control circuit PCC is different from that shown in FIG. 7. Embodiment 3 differs from Embodiment 2 shown in FIG. 7 in the following: a PMOS transistor P802 replaced the NMOS transistor N705 connected to the PMOS transistor P703; a PMOS transistor P801 replaced the NMOS transistor N704 connected to the PMOS transistor P702; an NMOS transistor N802 replaced the PMOS transistor P705 connected to the NMOS transistor N703; and an NMOS transistor N801 replaced the PMOS transistor 704 connected to the NMOS transistor N702.

These MOS transistors N801, N802, P801, and P802 are diode junctions with their gate and drain being short-circuited. In this configuration, Embodiment 3 produces the same effect as Embodiment 2 does. Furthermore, the advantage of Embodiment 3 is that process variation is easy to control because the diode junction NMOS transistors are connected to the NMOS transistors and the diode junction CMOS transistors are connected to the CMOS transistors, respectively.

As is the case in Embodiment 2 shown in FIG. 7, for the MOS transistors N801, N802, P801, and P802 which are respectively connected to each source of the MOS transistors P702, P703, N702, and N703, it is possible to assemble the N801 and N802 into one NMOS transistor and the P801 and P802 transistors into one PMOS transistor in arrangement. This benefit is reduced layout area.

<Embodiment 4>

Figure 9:
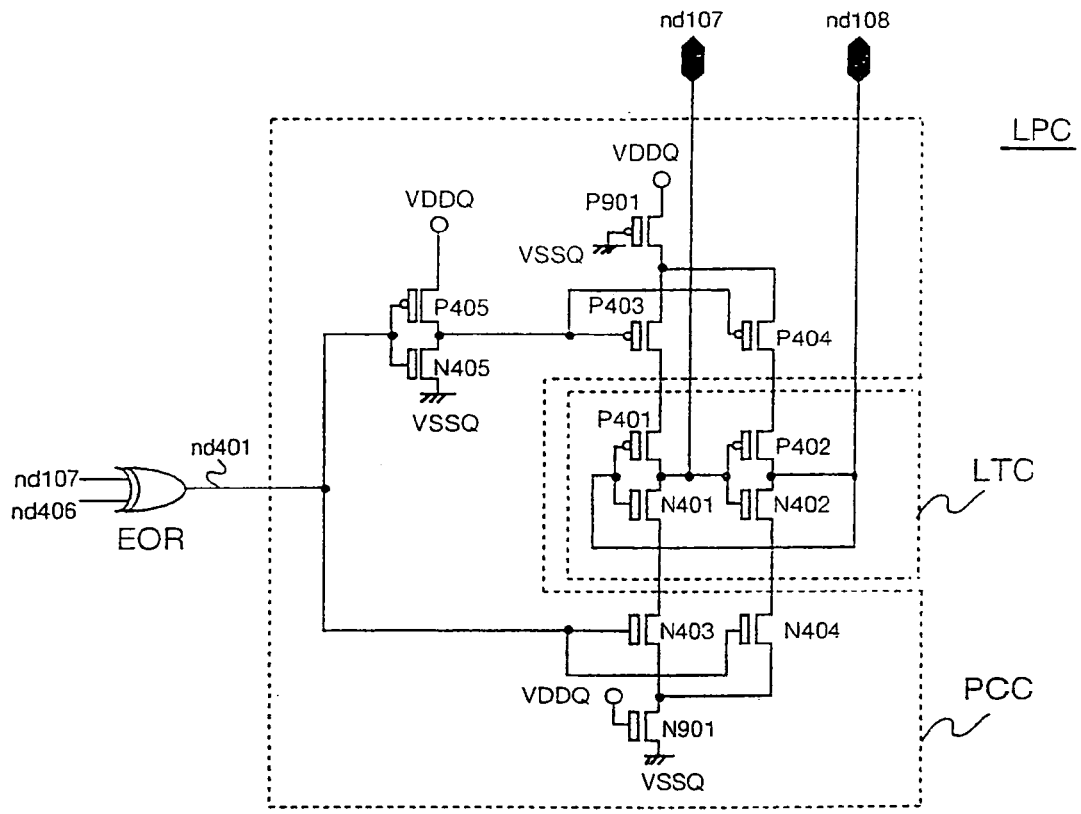

FIG. 9 is a circuit diagram illustrating yet another embodiment of the leak protection circuit LPC described in Embodiment 1, which depicts the elements of the LPC, wherein the configuration of the power control circuit PCC is different from that shown in FIG. 4. As compared with Embodiments 2 and 3 shown in FIGS. 7 and 8, the number of MOS transistors is reduced in Embodiment 4. To the source of the PMOS transistors P403 and P404 in the LPC of Embodiment 1 shown in FIG. 4, a new PMOS transistor 901 with its gate grounded is connected. To the source of the NMOS transistors N403 and N404, a new NMOS transistor N901 with its gate to which power supply voltage VDDQ is applied is connected. Embodiment 4 has the following feature. By taking advantage of ON resistance in a leaner region (nonsaturation region or ohmic region) of the drain current of the PMOS transistor P901 and the NMOS transistor N901, reducing the current flow through the latch LTC and integration on less area can be achieved.

<Embodiment 5>

Figure 10:
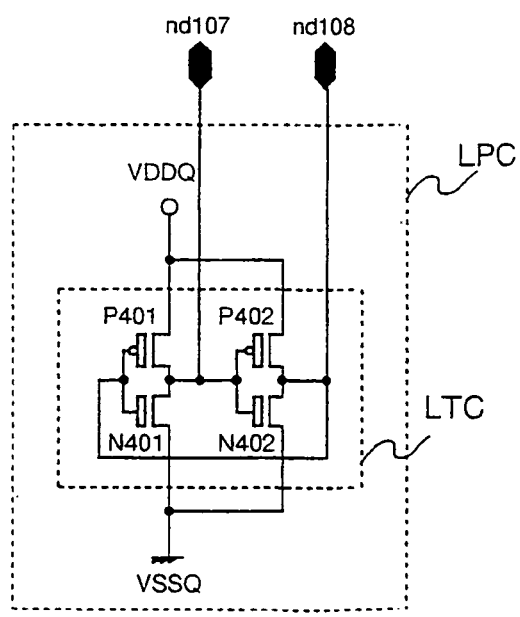
FIG. 10 is a circuit diagram illustrating a further embodiment of the leak protection circuit comprising a latch circuit that consists of two stages of inverters.

FIG. 10 is a circuit diagram illustrating a further embodiment of the leak protection circuit LPC described in Embodiment 1. The leak protection circuit LPC of Embodiment 5 comprises only the latch LTC, dispensing with the delay circuit DLY, exclusive OR circuit EOR, and power control circuit PCC. Leak prevention measures are taken by connecting the leak protection circuit LPC shown in FIG. 10 to the nodes nd197 and nd108 only. This is the simplest leak protection circuit and effective because of its smallest area to occupy if decrease of the conversion speed causes no problem.

<Embodiment 6>

Figure 11:
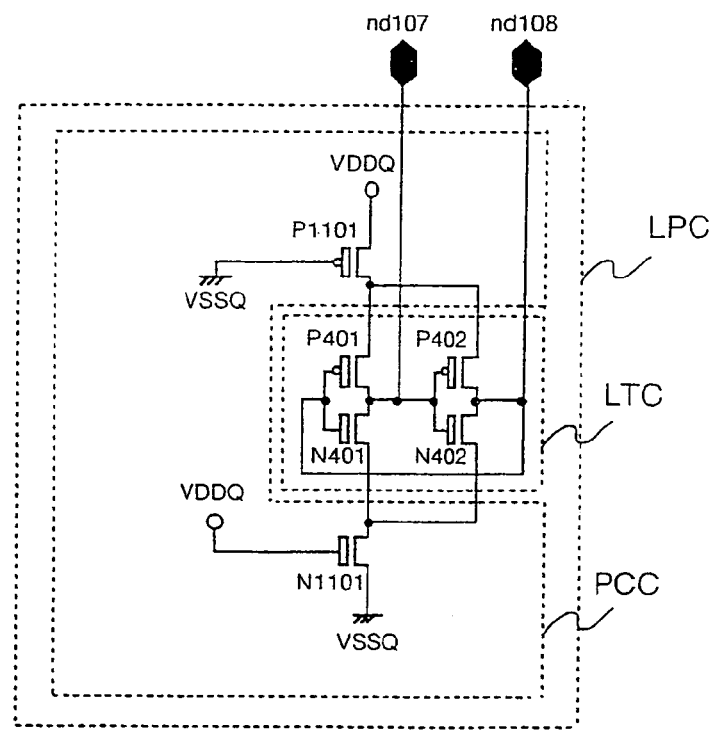
FIG. 11 is a circuit diagram illustrating one embodiment of power control of the inverters shown in FIG. 10.

FIG. 11 shows yet another LPC implementation, namely, Embodiment 6, wherein a power control circuit PCC is attached to the leak protection circuit LPC of Embodiment 5 shown in FIG. 10. The LPC circuit of Embodiment 6 is characterized as follows. A new PMOS transistor P1101 is connected in series to the source of the PMOS transistors P401 and P402, some components of the latch LTC, and ground potential VSSQ is applied to the gate of the P1101 transistor. In addition, an NMOS transistor N1101 is connected in series to the source of the NMOS transistors N401 and N402 and power supply voltage VDDQ is applied to the gate of the N1101 transistor.

In this configuration, the capacitance apparent to the nodes nd017 and nd108 is restricted and ON resistance is increased by increasing the gate length Lg of the MOS transistors P1101 and N1101. The current flow through the latch LTC can be restricted. Accordingly, Embodiment 6 has the advantage that it can avoid the decrease of the level conversion speed.

<Embodiment 7>

Figure 12:
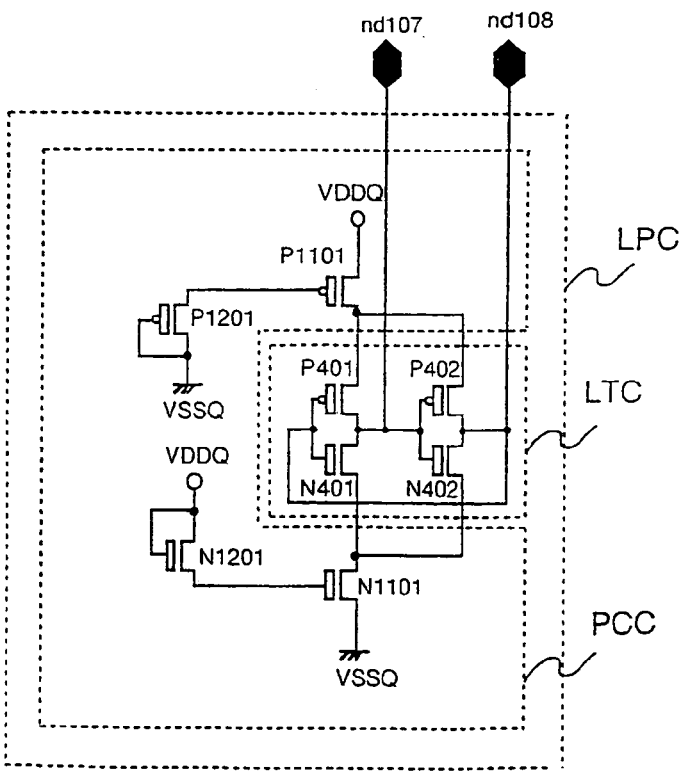
FIG. 12 is a circuit diagram illustrating another embodiment of power control of the inverters shown in FIG. 10.

FIG. 12 is a circuit diagram illustrating a still further LPC implementation, namely, Embodiment 7, wherein another embodiment of the power control circuit PCC in the leak protection circuit LPC of Embodiment 6 shown in FIG. 11 is shown. Embodiment 7 is characterized as follows. To the gate of the PMOS transistor P1101, ground potential VSSQ plus the threshold voltage of a PMOS transistor P1201 is applied. To the gate of the NMOS transistor N1101, power supply voltage VDDQ plus the threshold voltage of an NMOS transistor is applied. The PMOS transistor P1201 is a diode junction transistor whose source and drain are short-circuited. The NMOS transistor N1201 is also a diode junction transistor whose source and drain are short-circuited. In this configuration, the current flow through the latch LTC can be restricted. Accordingly, Embodiment 7 has the advantage that it can avoid the decrease of the level conversion speed.

<Embodiment 8>

Figure 13:
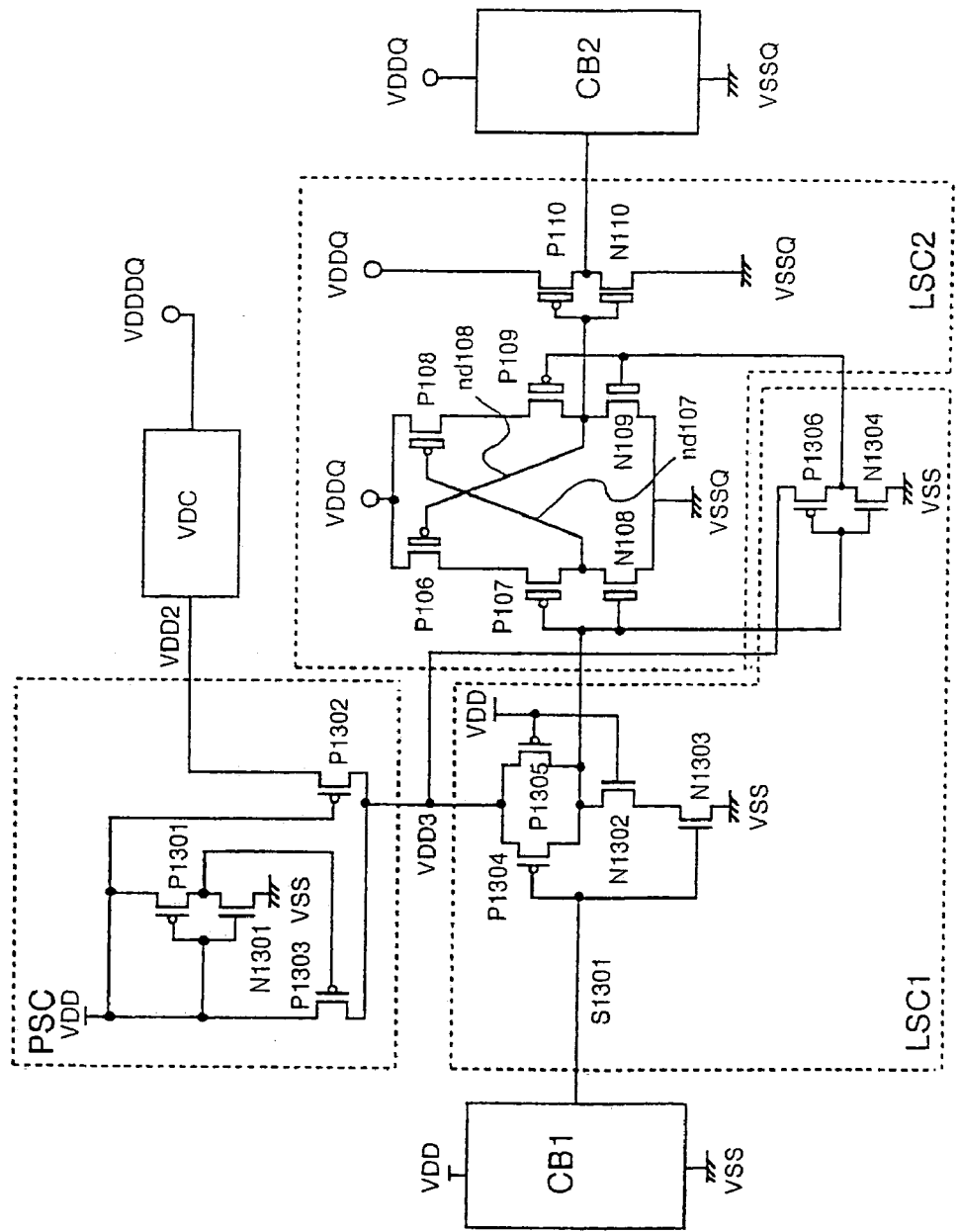
FIG. 13 is a circuit diagram illustrating one embodiment of the circuit for blocking off a leak, using a supply voltage stepped down from high voltage power supply VDDQ.

FIG. 13 shows another embodiment of the circuit for preventing a leak from occurring when the circuit CB1 driven by low voltage power supply VDD is placed in sleep mode. This circuit is incorporated in a level converter implementation without the voltage doubler. Because high voltage power supply VDDQ keeps on when the circuit CB1 is in sleep mode, a voltage-down converter VDC steps down the VDDQ to a new supply voltage VDD2. Using the VDD2, leak-preventing control is exerted.

Supply voltage VDD2 output from the voltage-down converter VDC is input to a power-line selection circuit PSC. The PSC exerts control to select supply voltage VDD2 when the low voltage power supply VDD is turned off. Supply voltage VDD2 input to the power-line selection circuit PSC is input to the source of a PMOS transistor P1302. Low voltage power supply VDD is input to the source of a PMOS transistor P1303 and an inverter consisting of a PMOS transistor P1301 and an NMOS transistor N1301. Output of the inverter consisting of the PMOS transistor P1301 and NMOS transistor N1301 is input to the gate of the PMOS transistor P1303. In this PSC circuit, when it is supplied with low voltage power supply VDD, the PMOS transistor P1303 turns on and the PMOS transistor P1302 turns off, and therefore; low voltage power supply VDD is selected. When low voltage power supply VDD is turned off, the PMOS transistor P1303 turns off and the PMOS transistor P1302 turns on, and therefore, supply voltage VDD2 is selected. Either voltage VDD or VDD2 selected is output as low supply voltage VDD3.

Low supply voltage VDD3 output from the power-line selecting circuit PSC is input to the LSC1 circuit, and then input to the source of PMOS transistors of a NAND gate which consists of PMOS transistors P1304 and P1305 and NMOS transistors N1302 and N1303 and the source of PMOS transistor P1306 of an inverter which consists of the PMOS transistor P1306 and an NMOS transistor N1304. The NAND gate has two inputs and one output and a signal S1301 output from the circuit CB1 driven by VDD and power supply voltage VDD are input to it. Output of the NAND gate is logic inverted by the gates of MOS transistors P107 and N108 in the LSC2 circuit and the inverter consisting of the PMOS transistor P1306 and NMOS transistor N1304, and then input to the gates of MOS transistors P109 and N109 in the LSC2 circuit.

By configuring the LSC1 circuit in this way, when low voltage power supply VDD is turned off, the node n107 is forcibly set at ground potential VSSQ and the node n108 at power supply voltage VDDQ. Thus, the node n107 can be set as a node at which logic is not determined whenever low voltage power supply VDD is off. In consequence, a leak in the inverter that follows the node nd108 can be prevented. Because it is effective that the thus configured circuit operates for just a short moment when low voltage power supply VDD is turned off or high voltage power supply VDDQ is turned on, that is, circuit power supply is turned on (normally, low voltage power supply VDD is turned on after the turn-on of high voltage power supply VDDQ), low capability of the voltage-down converter VDC for maintaining supply voltage VDD2 is acceptable.

In the configuration of Embodiment 8, it is not necessary to attach a latch to the signal transmission paths in the level converter, and therefore, Embodiment 8 has the advantage that it can carry out high-speed level conversion without the leak problem.

<Embodiment 9>

Figure 14:
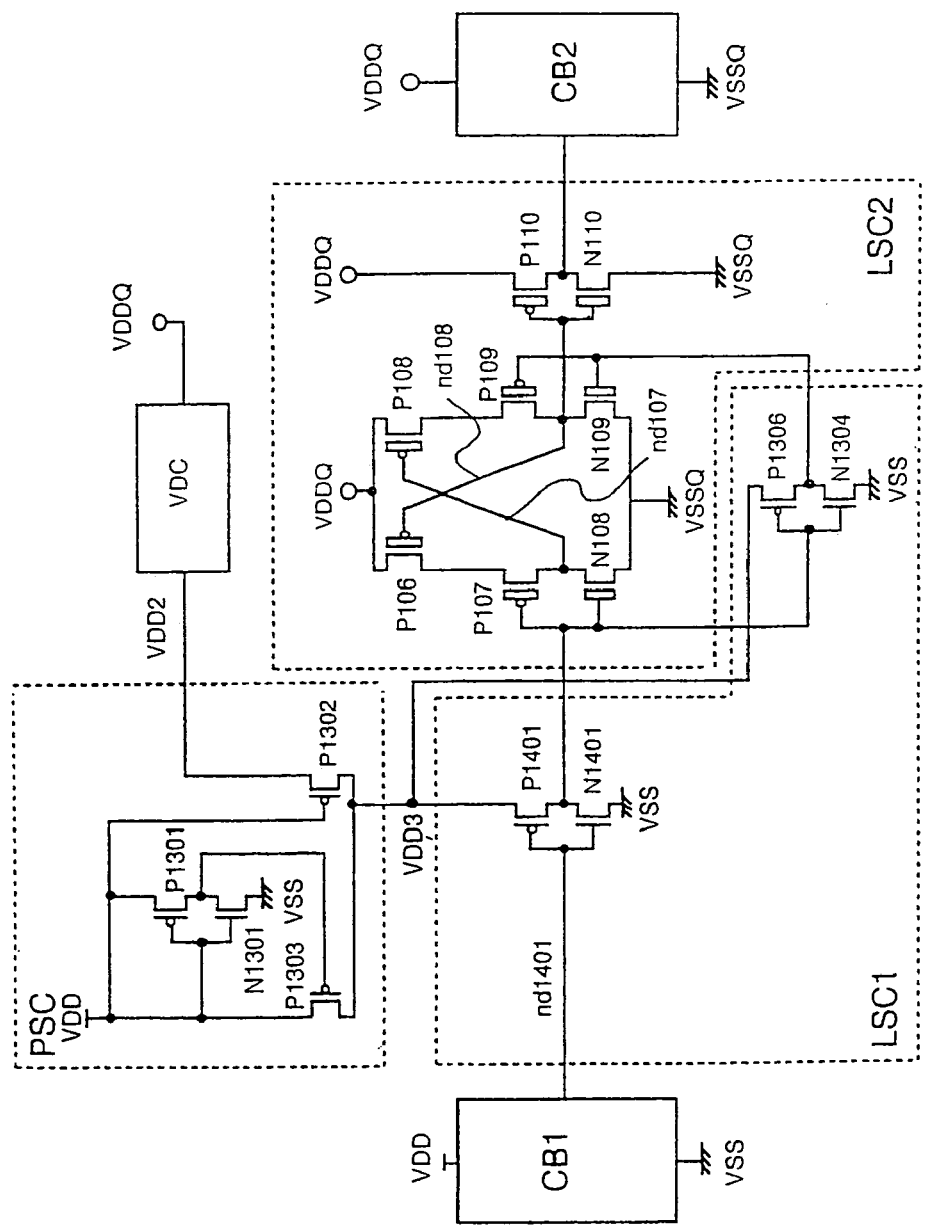
FIG. 14 is a circuit diagram illustrating another embodiment of the circuit for blocking off a leak, using a supply voltage stepped down from high voltage power supply VDDQ.

FIG. 14 shows yet another embodiment of the leak protection circuit described in Embodiment 8. FIG. 14 differs from FIG. 13 in the following. Instead of the NAND gate, an inverter consisting of MOS transistors P1401 and N1401 is employed and low supply voltage VDD3 can be input to the source of the PMOS transistor P1401, a component of the inverter. In this configuration, even when low voltage power supply VDD is turned off, the supply voltage is also applied to the inverter consisting of the MOS transistors P1306 and N1304, which precedes the LSC2 circuit. Consequently, a leak does not occur in the inverter consisting of the MOS transistors P110 and N110.

Upon the turn-off of VDD, the voltage at the node nd1401 drops to ground potential VSS level and, consequently, the node nd108 comes to be at high voltage power supply VDDQ. Thus, the safety of leak block-off is high. At the node nd1401 at which a signal from the circuit CB1 driven by low voltage is input, it is possible to form a latch circuit that is powered by low supply voltage VDD3 (for example, the latch consists of two stages of inverters in a loop as shown in FIG. 10). In that event, the logic of the inverter consisting of the MOS transistors P1401 and N1401 keeps determinate by the latch, and therefore, the safety of leak block-off is high.

<Embodiment 10>

Figure 15:
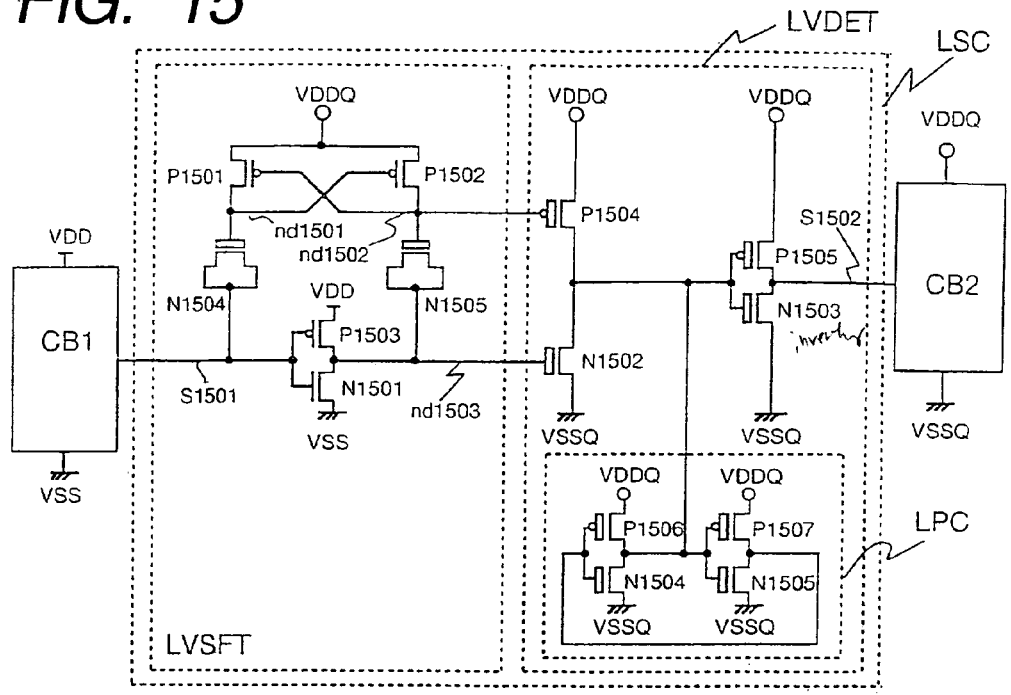
FIG. 15 is a circuit diagram illustrating a further embodiment of the level converter in which, after an input signal is level shifted, level conversion is performed for the input signal and the level shifted signal.

FIG. 15 shows a semiconductor device in accordance with another preferred embodiment (Embodiment 10) of the present invention. The semiconductor device of Embodiment 10 includes a level converter that is effective when there is quite a large difference between low voltage power supply VDD (for example, 1 V) and high voltage power supply VDDQ (for example, 3.3 V).

When there is quite a large difference between low voltage power supply VDD and high voltage power supply VDDQ, it is necessary for a conventional latch-type level converter to invert the latched voltage level in order to transmit an inverted logic signal derived from the already input signal. If the amplitude of the low voltage power supply VDD is too small, sufficient power cannot be gained to drive the NMOS transistors required for inverting the latched voltage level. This posed a problem of decrease of the level conversion speed. In Embodiment 10, level conversion using the latch is not carried out. An alternative level converter configuration is disclosed in which level conversion is performed by using an input signal and a signal with the amplitude as much as the shift to the inverse level of the input signal, thus avoiding the decrease of the level conversion speed.

The semiconductor device shown in FIG. 15 is formed on a semiconductor substrate by using a CMOS integration technology. A level converter LSC consists of a signal-level shifting block LVSFT and a signal-level determination block LVDET. The LSC is located between a low-voltage logic circuit CB1 which is driven by first power supply voltage (VDD) and a high-voltage logic circuit CB2 which is driven by second power supply voltage (VDDQ).

The signal-level shifting block LVSFT receives an input signal S1501 output from the low-voltage logic circuit CB1 and, from the input signal, drives a signal with the logic being inverted by an inverter consisting of a PMOS transistor P1503 and an NMOS transistor N1501. The LVSFT converts the Lo level (VSS) of the input signal and the signal derived from the input signal to a VDDQ less VDD level. This conversion is carried out by letting the above signals pass through a capacitor that is formed by, for example, the short-circuited source and drain electrodes and gate electrodes of NMOS transistors N1504 and N1505. To the output terminals of this capacitor, PMOS transistors P1501 and P1502 are connected. These PMOS transistors P1501 and P1502 are cross coupled; that is, the gate of the P1501 transistor and the drain of the P1502 transistor are connected and the gate of the P1502 transistor and the drain of the P1502 transistor are connected. The sources of the PMOS transistors P1501 and P1502 are connected to high voltage power supply VDDQ.

Figure 16:
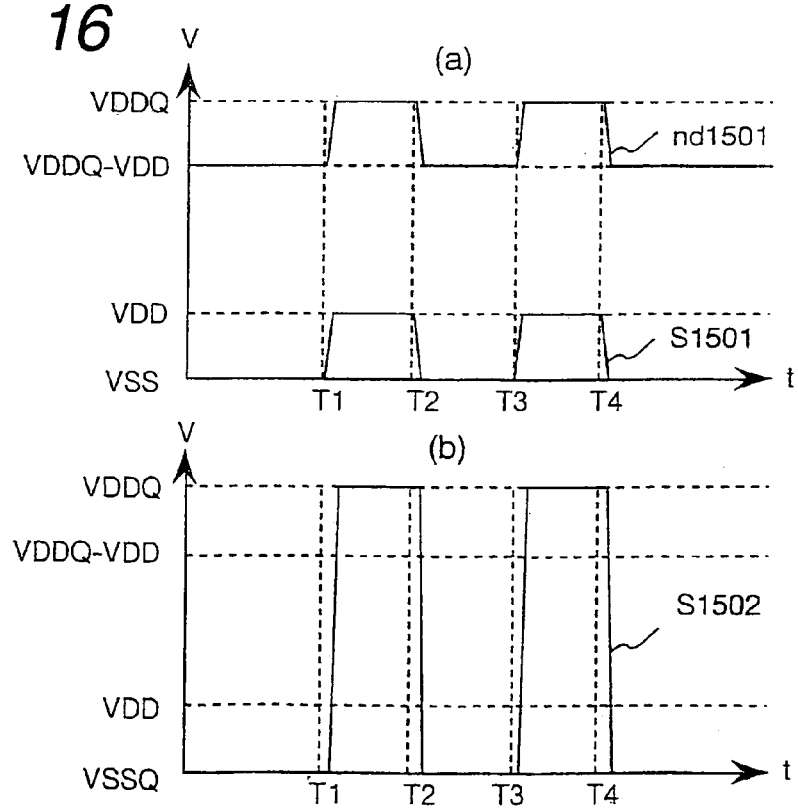
FIG. 16 shows voltage waveforms explaining potential transition at the nodes in the level converter embodiment of FIG. 15.

In this configuration, when the level of the signal S1503 is 0 V and a node nd1503 is at low power supply voltage VDD, a node nd1501 is set at VDDQ less VDD level because of coupling with the N1504 transistor of the capacitor and a node nd1502 is set at high power supply voltage VDDQ by turn-on of the PMOS transistor P1502. Inversely, when the level of the signal S1501 is VDD and the node nd1503 is at 0 V, the node nd1502 is set at VDDQ less VDD level because of coupling with the N1505 transistor of the capacitor, while the node nd1501 is set at high power supply voltage VDDQ. How the signal voltage amplitude changes is shown in FIG. 16(a). In FIG. 16(a), the waveform of the signal S1501 and its waveform at the node nd1501 are shown. The signal waveforms at the nd1503 and nd1502 nodes are opposite in phase to the waveforms shown in FIG. 16(a).

Outputs from the signal-level shifting block LVSFT are gained at the nodes nd1502 and nd1503. Output at the node nd1502 is input to the gate of a PMOS transistor P1504 in the signal-level determination block LVDET and output at the node nd1503 is input to the gate of an NMOS transistor N1502 in the LVDET.

Output at the node nd1502 is a signal with the amplitude of VDD; that is, voltage swinging from VDDQ less VDD to VDDQ. Output at the node nd1503 is a signal with the amplitude of VDD; that is, voltage swinging from ground level VSS to low voltage power supply VDD. Thus, the output signal from the node nd1502 turns the PMOS transistor P1504 on completely or places it in a half-on state. The output signal from the node nd1503 turns the NMOS transistor N1502 off completely or places it in a half-on state. Because the Hi level of the signal from the node nd1502 and the Hi level of the signal from the node nd1503 are completely opposite to each other in phase, it is impossible that the PMOS transistor P1504 and the NMOS transistor N1502 are placed in the half-on state simultaneously. In consequence, a signal with the amplitude of VDDQ appears at a drain at which the MOS transistors P1504 and N1502 are coupled. This signal appearing at the coupled drain is input to an inverter consisting of a PMOS transistor P1505 and an NMOS transistor N1503. An output signal S1502 from the inverter is input to the high-voltage logic circuit CB2 that follows the LVDET. The waveform of the output signal S1502 is shown in FIG. 16(b).

In FIG. 15, an LPC circuit is shown that consists of two inverters; one consisting of MOS transistors P1506 and N1504 and the other consisting of MOS transistors P1507 and N1505. This LPC comprises only the latch, which is the same as the leak protection circuit LPC of Embodiment 5 shown in FIG. 10.

In order to drive the PMOS and NMOS transistors in the logic circuit CB2 driven by high voltage, the semiconductor device of Embodiment 10 is capable of carrying out high-speed level conversion from low to high voltages for greater voltage difference than accommodated by previous level converters.

<Embodiment 11>

Figure 17:
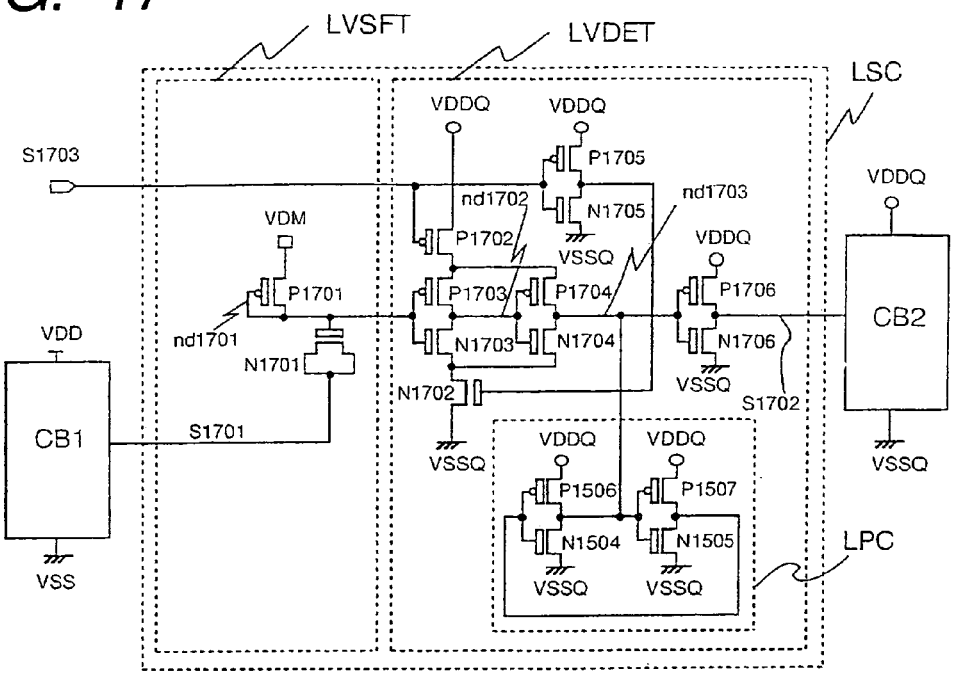
FIG. 17 is a circuit diagram illustrating a further embodiment of the level converter using intermediate potential.

FIG. 17 shows a semiconductor device in accordance with yet another preferred embodiment (Embodiment 11) of the present invention. Embodiment 11 is another embodiment of the semiconductor device including a level converter that is effective when there is quite a large difference between low voltage power supply VDD (for example, 0.7 V) and high voltage power supply VDDQ (for example, 3.3 V). The level converter LSC consists of a signal-level shifting block LVSFT and a signal-level determination block LVDET. The LSC is located between a low-voltage logic circuit CB1 which is driven by first power supply voltage (VDD) and a high-voltage logic circuit CB2 which is driven by second power supply voltage (VDDQ).

In FIG. 17, one exemplary signal S1701 is output from the low-voltage logic circuit CB1. The S1701 signal is to be input to the high-voltage logic circuit. The amplitude of the S1701 logic signal ranges from ground voltage VSS to power supply voltage VDD. For example, its Lo level is 0 V and Hi level is the power supply voltage VDD. The input signal S1701 passes through a capacitor N1701 and is input to an inverter consisting of a PMOS transistor P1703 and an NMOS transistor N1703 in the signal-level determination block LVDET. Then, a logic inverted signal is output at a node nd1702. The signal-level shifting block LVSFT converts the Hi level (VDD) of the signal at a node nd1701 to a VDM plus VDD voltage level. This voltage level conversion is carried out by letting the above signal pass through a capacitor that is formed by, for example, the short-circuited source and drain electrode and gate electrode of an NMOS transistors N1701. The above VDM is intermediate potential that is about a half of the high voltage power supply VDDQ. The VDM is applied from the outside or generated in the semiconductor by stepping down from the high voltage power supply VDDQ or stepping up from the low voltage power supply VDD. To the gate of the capacitor N1701, the drain of a PMOS transistor P1701 is connected. The PMOS transistor P1701 is diode junction with its gate and drain being short-circuited and its source is connected to intermediate potential VDM.

Figure 18:
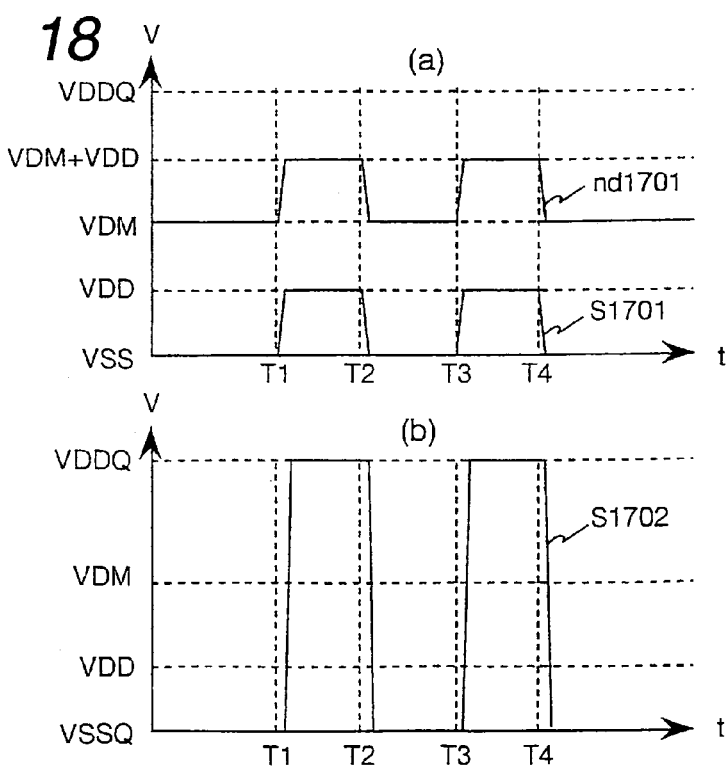
FIG. 18 shows voltage waveforms explaining potential transition at the nodes in the level converter of FIG. 17.

In this configuration, when the level of the signal S1701 is 0 V, the node nd1701 is set at VDM. Inversely, when the level of the signal S1701 is VDD, the node nd1701 is set at VDM plus VDD because of coupling with the capacitor N1701. How the signal voltage amplitude changes is shown in FIG. 18(*a*). The S1701 signal waveform and its waveform at the node nd 1701 are shown in FIG. 18(*a*).

In the signal-level determination block LVDET, the above-mentioned signal from the node nd1702 passes through the gates of an inverter consisting of a PMOS transistor P1704 and an NMOS transistor N1704 and is further input to an inverter consisting of a PMOS transistor P1706 and an NMOS transistor N1706. Because the inverters have characteristics that they are able to amplify and transmit even a small amplitude signal whose voltage level is about half the VDDQ to the following stage, level conversion can be carried out at high speed. As the result of conversion, a signal S1702 is output from the inverter consisting of the PMOS transistor P1706 and NMOS transistor N1706 and its waveform is shown in FIG. 18(*b*).

Meanwhile, when a signal with small amplitude of voltage around the intermediate potential VDM is input to an inverter as in the present embodiment, the inverter to which the signal was input is to be used with its NMOS and PMOS transistors both being placed in the half-on state. Consequently, a problem arises that a penetrating current occurs when the inverters are on standby in the above-described configuration, which would not develop in normal CMOS circuits as either a PMOS or NMOS transistor turns off completely. This problem is solved essentially by supplying an external control signal for controlling the power supply to the inverters and latch means for latching a voltage level given by level conversion.

A conceivable manner of power supply control is switching control that is implemented as follows. Adjacent to the inverter that receives signal input from the node nd1701, an NMOS transistor N1702 should be installed to connect to the source of the NMOS transistor N1703 and a PMOS transistor P1702 should be installed to connect to the source of the PMOS transistor P1703. Input an external signal S1703 to the gate of the PMOS transistor P1702 and input an inverted signal of the external signal S1703 to the gate of the NMOS transistor N1702. The inverted signal is generated by letting the signal S1703 through an inverter consisting of a PMOS transistor P1705 and an NMOS transistor N1705.

If the inverter consisting of the PMOS transistor P1703 and NMOS transistor N1703 can perform sufficient level determination, the inverter consisting of the PMOS transistor P1704 and NMOS transistor N1704 is dispensable. While two stages of inverters are assumed employed in Embodiment 11, because an optimum number of inverter stages will be determined in the process of LSI design, the inverters may be added up to the optimum number. The power supply of these inverters is characterized by being driven by the MOS transistors P1702 and N1702. For other inverters for which a leak is concern, it is also conceivable to connect a PMOS transistor in series to the source of the inverter-component PMOS transistor and an NMOS transistor in series to the source of the NMOS transistor as well and check the current through the inverter. In this case, the benefit hereof is reduced power consumption, though the conversion speed somewhat decreases.

When the power supply is turned off by the MOS transistors P1702 and N1702, it is necessary to hold the result of conversion. This can be done by the latch circuit consisting of two inverters; one consisting of MOS transistors P1506 and N1504 and the other consisting of MOS transistors P1507 and N1505. As in Embodiment 10, this latch circuit LPC is a leak protection circuit comprising only the latch, which is the same as the leak protection circuit LPC of Embodiment 5 shown in FIG. 10. The latch holds the voltage level as the result of conversion at the node nd1703 and thus can avoid a penetrating current which occurs due to an indeterminate level of the signal to be input to the inverters when the power supply is turned off.

If power control explained in Embodiments 1 and 2 is exerted, this latch LPC will be made more efficient without decreasing the conversion speed. In that event, for example, it is conceivable to get and use the exclusive OR of the level of the signal from the node nd1703 and the level of the signal S1702.

<Embodiment 12>

Figure 19:
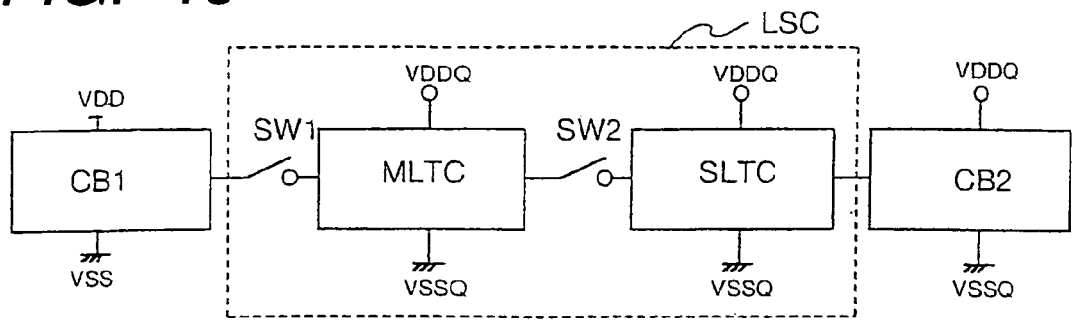
FIG. 19 is a circuit diagram illustrating a further embodiment of the level converter using dynamic control.

FIG. 19 shows a block diagram of a semiconductor device in accordance with a further preferred embodiment (Embodiment 12) of the present invention. Embodiment 12 concerns a preferred level converter embodiment that is effective when the power supply VDD (for example, 0.5 V) for the low-voltage circuit CB1 is equivalent to or lower than the threshold voltage (for example, 0.7 V) of the MOS transistor components of the high-voltage circuit CB2 powered by VDDQ (for example, 3.3 V).

The level converter of Embodiment 12 is comprised of a master latch MLTC, a slave latch SLTC, a switch SW1 located between the low-voltage circuit CB1 and the master latch MLTC, and a switch SW2 located between the master latch MLTC and the slave latch SLTC. This is a dynamic level converter that performs level conversion in synchronization with an external signal (such as, for example, clock).

The level converter is supplied with power from VDDQ and VSSQ and the following high-voltage circuit CB2 is also supplied with the same voltage and ground potential. When the power supply VDD for the low-voltage circuit CB1 becomes as low as or lower than the threshold voltage of high voltage power supply VDDQ and the MOS transistors operating on high voltage, the level converter of Embodiment 12 becomes unable to directly drive these MOS transistors. In Embodiment 12, thus, a sense amplifier like the one for use in DRAM circuits is used to convert the VDD amplitude to VDDQ amplitude. The sense amplifier is a differential input amplifier with a pair of differential signal input nodes that are placed beforehand in a quasi-stable state (that is, these nodes are precharged). A signal with the amplitude of VDD, which is a small amplitude signal, and its inverted signal are input to the differential signal pair nodes and differential amplification is performed.

Figure 21:
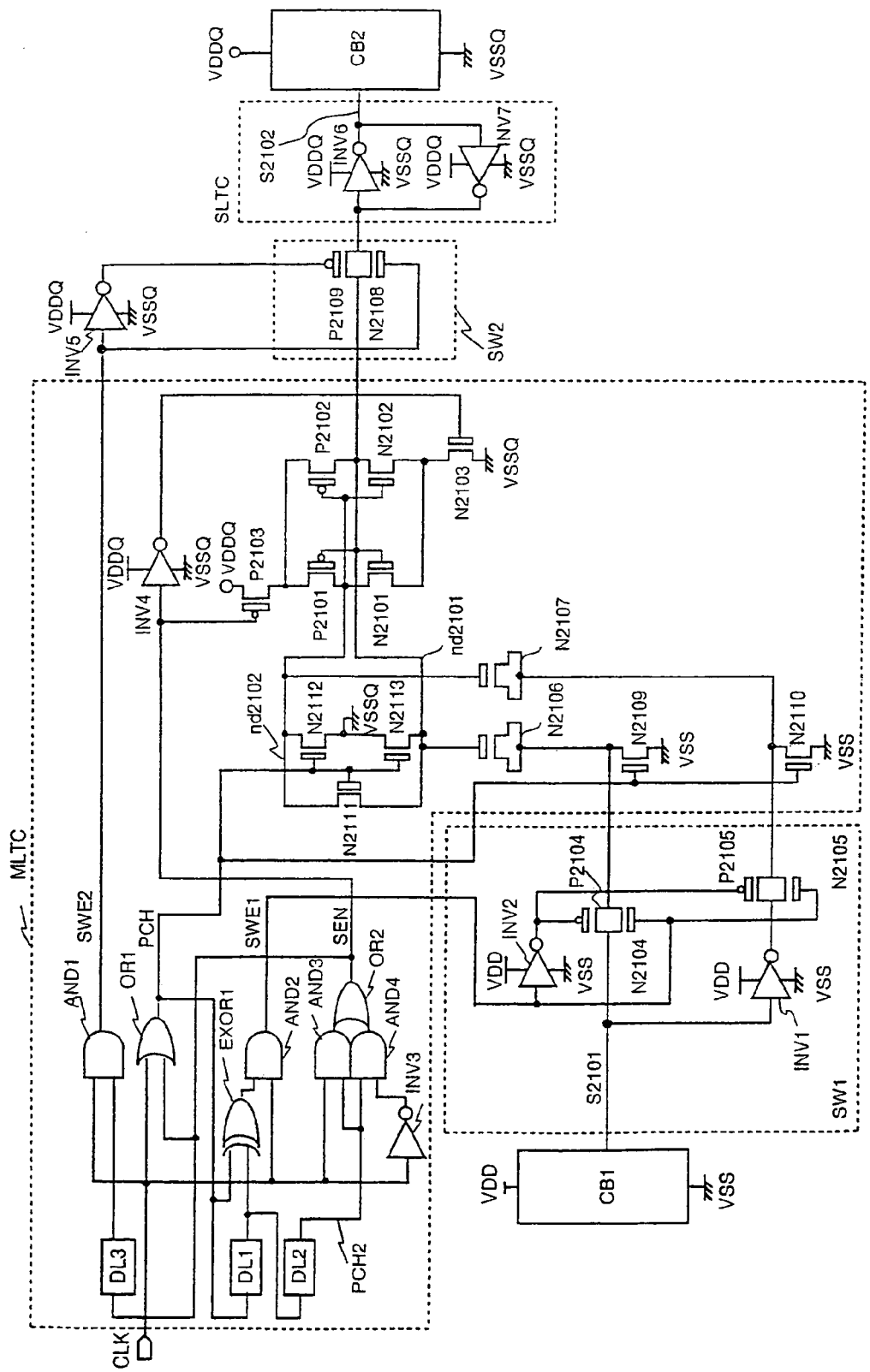
FIG. 21 is a circuit diagram illustrating a level feedback circuit embodiment for realizing the level converter of FIG. 19.
Figure 22:
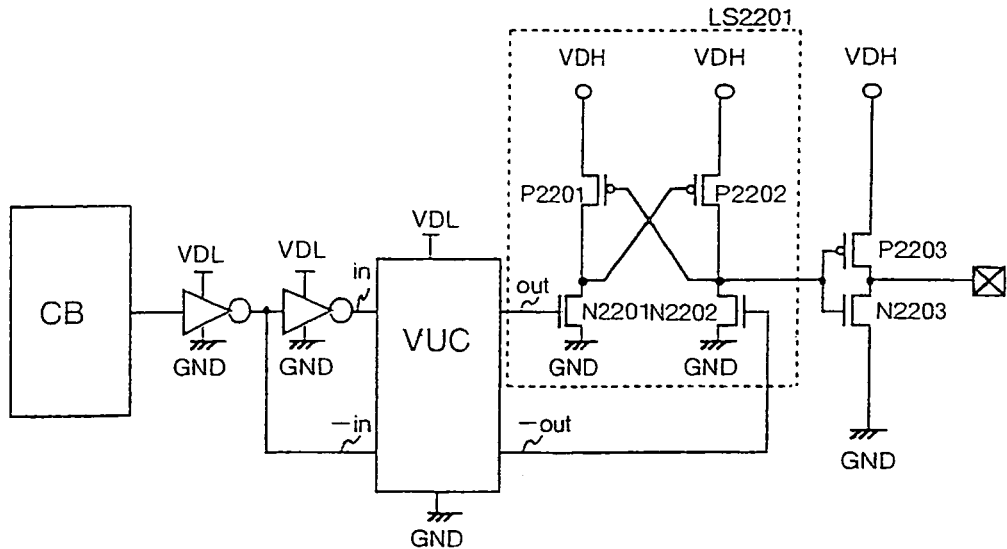
FIG. 22 is a circuit diagram illustrating a prior art level converter example including a voltage-up circuit.
Figure 23:
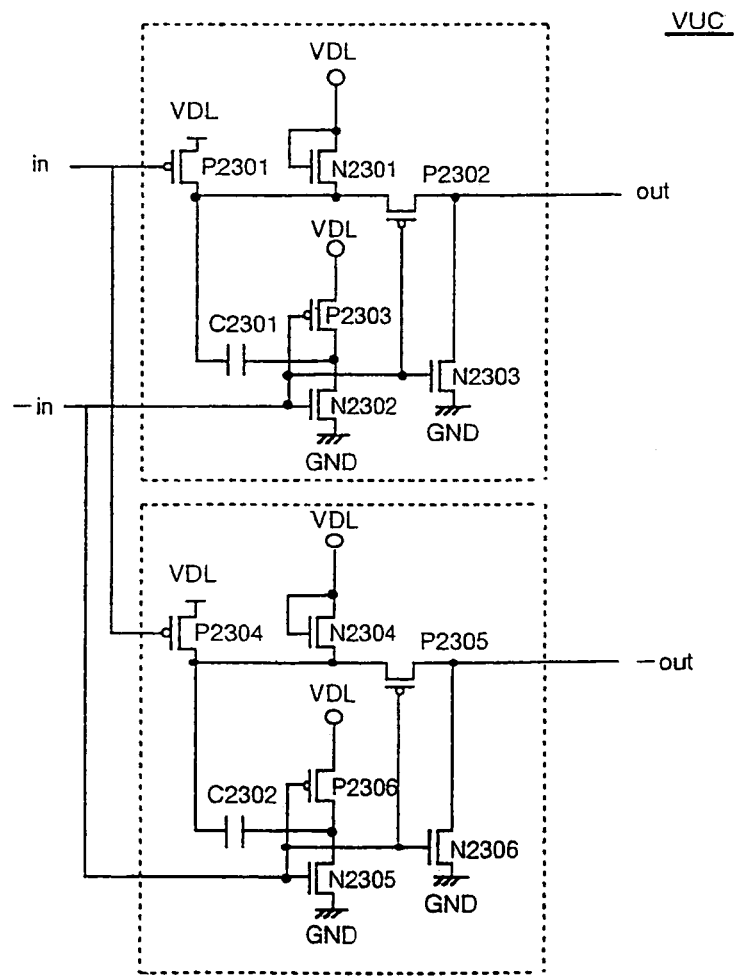
FIG. 23 is a circuit diagram showing the voltage-up circuit disclosed in the prior art level converter example of FIG. 22.
Figure 24:
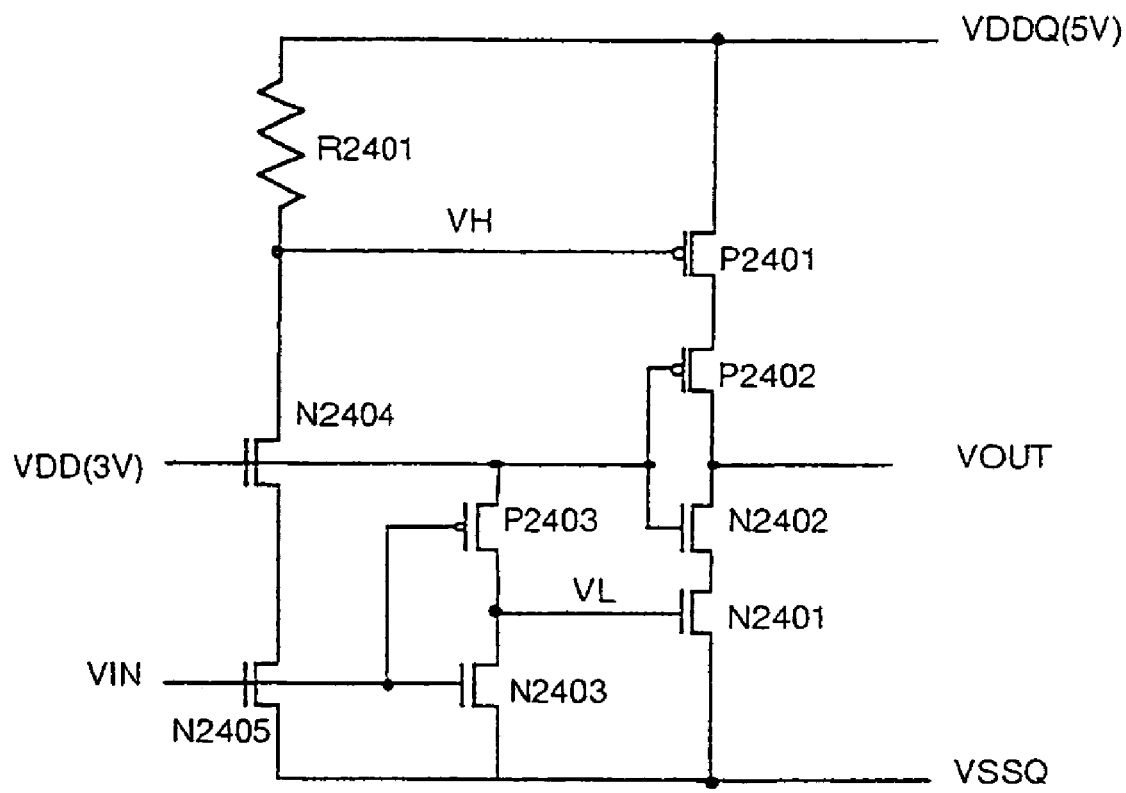
FIG. 24 is a circuit diagram illustrating another prior art level converter example in which level conversion is performed after an input signal is level shifted.

A circuit for realizing such amplification is shown in FIG. 21. Clock CLK is input to an OR gate OR1, AND gates AND1–AND3, and an inverter INV3.

Signals to control this circuit will first be described. A precharge signal PCH is a signal whose state is determined by the output from the OR gate OR1 that gives the logical sum (OR) of the clock CLK and a sense activation signal SEN. A signal SWE1 for turning the switch SW1 on or off is a signal whose state is determined by the output from the AND gate AND2 that gives the logical product (AND) of the clock CLK and the output result from the exclusive OR gate EXOR1 that gives the exclusive OR of the precharge signal PCH and its delayed signal output from a delay circuit DL1.

The state of the sense activation signal SEN is determined by the output result from another OR gate OR2 to which the following are input: the output from the AND gate AND3 that gives the logical product (AND) of the clock CLK and a signal PCH2 obtained by delaying the precharge signal PCH through the delay circuits DL1 and DL2; and the output from the AND gate AND4 that gives the logical NOT and logical product (AND) of the signal PCH2 and the clock output from the inverter INV3.

A signal SWE2 for turning the switch SW2 on or off is a signal whose state is determined by the output result from the AND gate AND1 that gives the logical product (AND) of the clock CLK and the sense activation signal SEN delayed through the delay circuit DLC.

Then, the operation of the master latch block MLTC shown in FIG. 21 will be explained. The SW1 separates a signal S2101 input from the low-voltage circuit CB1 into a positive logic and a negative logic obtained by inverting the input signal through an inverter INV1. The positive logic signal of S2101 is input to an analog switch consisting of a PMOS transistor P2104 and an NMOS transistor N2104. Its negative logic signal is input to another analog switch consisting of a PMOS transistor P2105 and an NMOS transistor N2105.

To the gates of these analog switch, the signal SWEL is input to the NMOS transistor gates and the signal obtained by inverting the SWEL signal through an inverter INV2 is input to the PMOS transistor gates, so that switch on/off is controlled. Output lines from these analog switches are respectively connected to capacitors N2106 and N2107 precharged to VSS by NMOS transistors N2109 and N2110 in the precharged state. The capacitors N2106 and N2107 are respectively connected to differential signal pair nodes nd2101 and nd2102. The differential signal pair nodes are precharged to VSSQ by NMOS transistors N2111, N2112, and N2113.

Precharge control is exerted by driving the NMOS transistors N2109, N2110, N2111, N2112, and N2113 by the above-mentioned precharge signal PCH. To the nodes nd2102 and nd2102, the signals with the low voltage amplitude are transmitted through the capacitors N2106 and N2107. For example, when the level of the signal S2101 is low (Lo), the node nd 2101 is set at VSSQ and the node nd2102 is set at VDD. Conversion of this small amplitude signal to a signal with the VDDQ amplitude is performed by a sense amplifier consisting of PMOS transistors P2101 and P2102 and NMOS transistors N2101 and N2102 converts.

The sense amplifier can be activated by activating the gates of the MOS transistors P2103 and N2103 respectively connected to power supply VDDQ and ground VSSQ. For this activation, the above-mentioned sense activation signal SEN is used. The activation signal SEN is input to the gate of the PMOS transistor P2103 and a signal obtained by inverting the logic of the activation signal SEN through an inverter INV4 is input to the gate of the NMOS transistor N2103.

The high supply voltage VDDQ level signal as the result of conversion is transmitted through an analog switch SW2 consisting of a PMOS transistor P2109 and an NMOS transistor N2108 to the following slave latch block SLTC. The switch SW2 on/off is controlled by the signal SWE2. The signal SWE2 is input to the gate of the NMOS transistor N2108 and a signal obtained by inverting the logic of the signal SWE2 through an inverter INV5 is transmitted to the PMOS transistor P2109.

The slave latch block SLTC will be then explained. The slave latch is a circuit that is able to hold the signal resulted from conversion which is output from the switch SW2 when the SW2 is turned on even after the SW2 is turned off. In this embodiment, the SLTC comprises a latch consisting of two stages of inverters INV6 and INV7. The VDDQ level signal resulted from the conversion by the master latch MLTC and passed through the switch SW2 is input via the slave latch SLTC to the high-voltage logic circuit CB2.

An example of how the above-mentioned control signals control the dynamic level converter thus configured with the switch SW1, master latch MLTC, slave latch, and switch SW2 will now be explained, using a timing chart shown in FIG. 20(a). In synchronization with the rising edge of a clock pulse, the control of the components of the level converter starts. The numbered arrows shown in FIG. 20(a) indicate the sequence in which the control signals are triggered, initially triggered by the rising edge of a clock pulse.

First, at time T1, the precharge signal PCH turns Lo, when triggered by the rising edge of clock CLK, and this indicates the end of precharge (see arrow 1).

As the precharge signal PCH falls, then, the signal SWEL becomes Hi to turn the switch SW1 on (see arrow 2).

The signal SWE1 stays Hi for a moment and turns Lo. At timing when the signal SWE1 changes from Hi to Lo (after a momentary delay), the sense activation signal SEN turns Hi, and the sense amplifier starts its operation (see arrow 3).

To synchronize with time when the sense amplifier will complete its task of signal amplification, the Hi sense activation signal SEN is delayed by a delay circuit. As the delayed sense activation signal SEN keeps Hi, the signal SWE2 turns Hi, turning the switch SW2 on (see arrow 4).

As the clock falls at time T2, the signal SWE2 turns Lo (see arrow 5). Then, the switch SW2 turns off.

Upon the detection of the turning Lo of the signal SWE2, the activation signal SEN turns Lo, making the sense amplifier operation terminate (see arrow 6.)

When the activation signal SEN turns Lo, the precharge signal PCH turns Hi (see arrow 7) and precharge resumes.

In this way, it is made possible that a signal input from the low-voltage logic circuit CB1 is low-to-high level converted and transmitted to the high-voltage logic circuit CB2 in one cycle of clock CLK.

Figure 20:
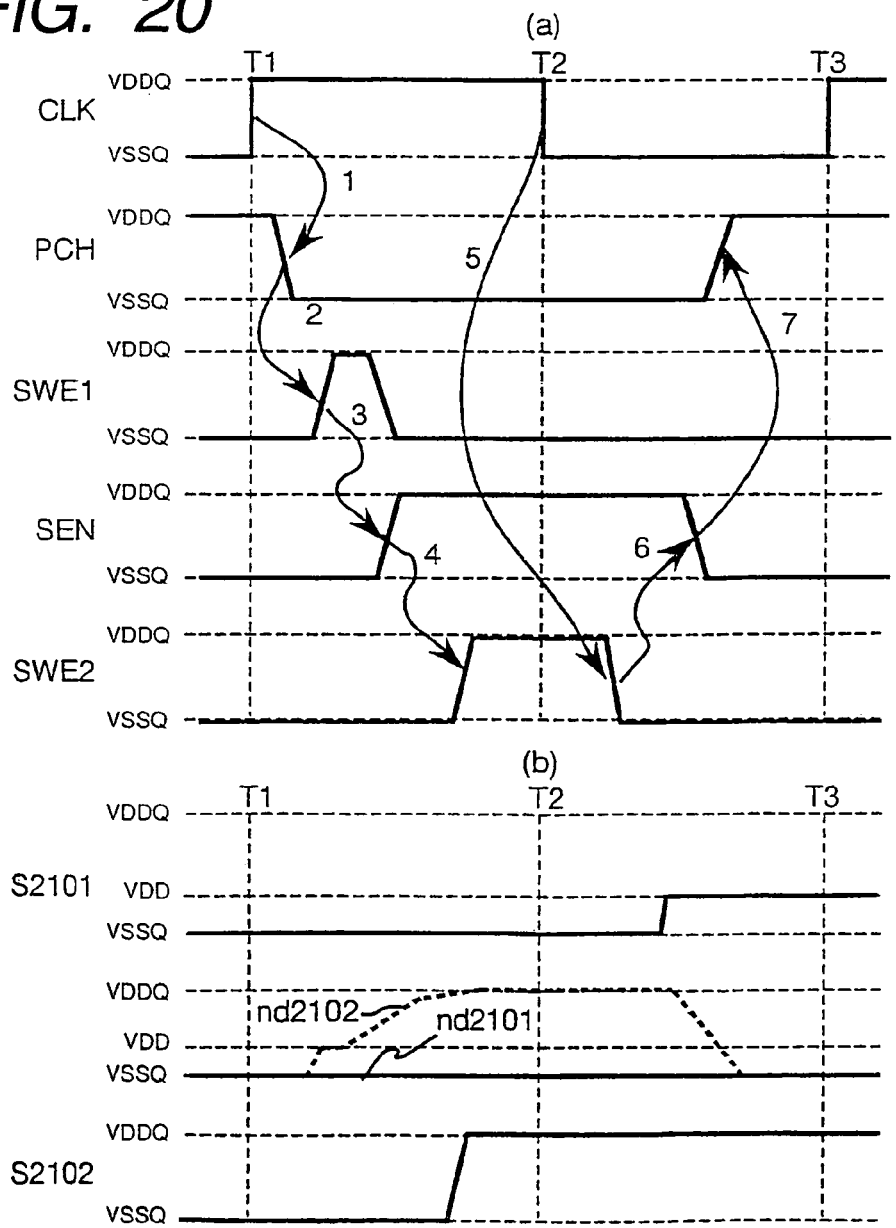
FIG. 20 shows (a) the waveforms of control signals and (b) voltage waveforms explaining potential transition at the nodes in the level converter of FIG. 19.

Then, how the input signal is transmitted and its level is converted to high will be explained, using FIG. 20(b). Time T1, T2, and T3 designated in FIG. 20 (b) are assumed corresponding to the time T1, T2, and T3 in FIG. 20(a). Explanation will be made on the assumption that the signal S2101 from the low-voltage logic circuit CB1 is Lo (VSS level) at time T1.

In synchronization with the rising edge of clock CLK, operation starts. When the switch SW1 turns on after precharge terminates, the signal S2101 is transmitted to the nd2101 and nd2102 nodes. At this time, because of capacitance coupling, the node nd2102 is set at VDD and the node nd2102 remains as is. In this state, when the sense amplifier is activated, the voltage at the node nd2102 is amplified to VDDQ and the voltage at the node nd2101 is amplified to VSSQ; that is, the signal is amplified to have the amplitude between VSSQ and VDDQ. When the switch W2 turns on after the completion of amplification, the signal is transmitted to the slave latch SLTC and output as the output signal S2102.

A feature of the level converter of Embodiment 12 is that it is capable of level conversion at high speed in the manner described above even if low voltage power supply VDD is lower than the threshold voltage of the MOS transistors driven by high voltage. The disclosed dynamic level converter of Embodiment 12 is illustrative and it should be understood that the present invention is applicable to a level converter that is provided with dynamic control and precharge means equivalent to those explained above.

<Embodiment 13>

Figure 25:
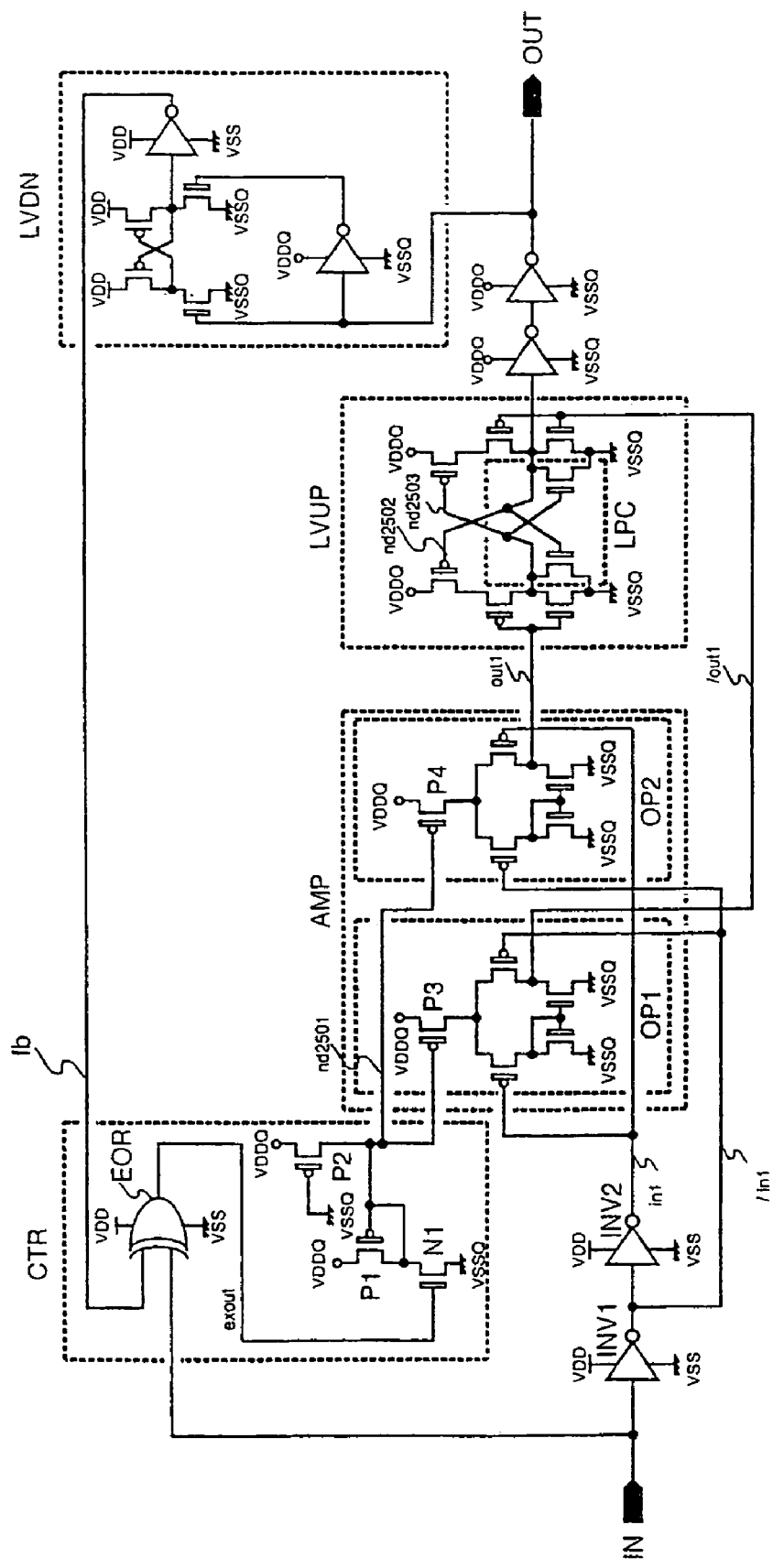
FIG. 25 is a circuit diagram illustrating a further embodiment of the level converter using voltage amplifiers.

FIG. 25 shows a still further preferred level converter embodiment (Embodiment 13) in which, after the input signal is amplified by voltage amplifiers (AMP), it is converted to an output signal with larger amplitude. This level converter circuitry is comprised of a voltage amplification unit AMP which amplifies the input signal by voltage amplifiers, a shift-level determination block LVUP which is configured as a conventional level converter, a leak protection circuit LPC which holds a voltage level determined by the shift-level determination block and prevents a leak in the following stages of inverters, a level-down converter LVDN which steps down the amplitude of a large amplitude output signal to feed it back to a control circuit, and the control circuit CTR which exerts control to activate and deactivate the voltage amplification unit. In FIG. 25, by way of example, operational amplifiers (op-amps) connected to power supply VDDQ and VSSQ are used as the AMP. These op-amps OP1 and OP2 must carry steady current to amplify small amplitude signals. For reducing power consumption, however, it is desirable to allow current to flow through the AMP only when the level converter is operating. To do this, it is necessary to cut the steady current when the level converter is not operating. Control hereof is implemented by the control circuit CTR. The control circuit, which will be explained in detail later, is characterized as follows. It controls the gate voltage of MOS transistors P1 and P3 for op-amp current control to allow current to flow through the op-amps OP1 and OP2 when detecting the level shift of an input signal only and shut off the current flow through the op-amps when detecting the level shift of an output signal after the level converter converts the input signal to the output signal.

Now, the method of conversion from small amplitude input signal to large amplitude input signal will be explained. First, an input signal is input to the op-amps for level conversion and the control circuit CTR as well. The control circuit activates the op-amps when detecting level change of the input signal. On the other hand, the input signal to be input to the op-amps is separated into complementary signals in1 and /in1 by inverters INV1 and INV2. The complementary signals in1 and /in1 are respectively input to a pair of differential input op-amps. After the complementary signals in1 and /in1 are amplified by the pair of op-amps, they are output as complementary signals out1 and /out1, respectively. The complementary signals out1 and /out1 are input to the conventional level converter and eventually converted to an output signal with amplitude of VDDQ. Taking advantage of level change of the output signal, then, the control circuit CTR exerts control to shut off the current flow through the op-amps.

Taking advantage of a delay of time to be taken for converting the input signal to output signal, the control of the op-amps is carried out by detecting a state that only the input signal level has shifted and a state that the output signal level has also shifted after the level converter is activated. Because the signal amplitude differs before and after level conversion, however, simple comparison using a normal logic circuit cannot be applied. For this reason, a feedback signal fb is generated from the output signal with its amplitude reduced to the amplitude of the input signal (level down) and compared with the input signal in a logic circuit of small amplitude.

This comparator circuit can be realized by exclusive OR (EOR) of the input signal and the feedback signal, assuming that these signals match in logic. By this circuit, an op-amp control signal exout can be generated. This signal output turns high (VDD) when only the input signal level shift occurs and turns low (0 V) as soon as the output signal level shift occurs after the level converter is activated.

Then, the method of activating the above op-amps OP1 and OP2 using the opamp control signal will be explained. The op-amps OP1 and OP2 shown in FIG. 25 respectively include PMOS transistors P3 and P4 for current control with their gates being respectively connected to the gate and drain of a PMOS transistor P1 forming a current mirror. To this drain, the drain of an NMOS transistor N1 is connected. To the gate of the NMOS transistor N1, the above op-amp control signal is input. When the level sift of an input signal occurs, the op-amp activation signal turns high (VDD). Thus, the NMOS transistor turns on and a node nd2501 is set low (0 V). When the node nd2501 is set low (0 V), the PMOS transistors P3 and P4 for current control in the op-amps turn on, and therefore, current flows through the op-amps and the op-amps are activated. In consequence, complementary signals in1 and /in1 input to the op-amps are amplified to a voltage that is determined by the gain of the op-amps. In this relation, even if the power supply voltage VDD of the input signal IN is lower than 1 V, because the op-amps circuitry does not include a latch which, however, exists in the conventional level converter, high-speed signal amplitude conversion can be performed for lower voltage than convertible by previous level converters.

Then, output complementary signals out1 and /out1 are respectively logically converted to a signal with amplitude between VDDQ and VSSQ by the conventional level converter and the output signal level shifts to a determinate level. When the output signal level shifts, the level of the signal output from the level-down converter also shifts and the output of the exclusive OR circuit EOR turns low (0 V). Thus, the NMOS transistor turns off and the potential at the node nd2501 rises toward VDDQ. In consequence, the PMOS transistors for current control in the op-amps turn off and stop the current flow through the op-amps. Thus, current consumption can be reduced.

To make the potential at the node nd2501 rise to VDDQ completely, a PMOS transistor P2 is used in this embodiment. The PMOS transistor P2 is designed to be sufficiently smaller than the NMOS transistor N1 and VSSQ is always applied to its gate. In this design, when the NMOS transistor N1 is on, its great drive power makes the node nd2501 low, whereas a path to VDDQ only is formed when the NMOS transistor N1 turns off, making it possible to keep the node nd2501 high (VDDQ). While VSSQ is always applied to the gate of the PMOS transistor P2 in this embodiment, it is possible to control the voltage of this gate separately, using a control signal. For example, control may be exerted so that the PMOS transistor P2 can turn off when the NMOS transistor N1 is operating. In that event, setting the node nd2501 low (0 V) will be done more quickly when activating the op-amps, though control will be complex. The resultant benefit is increasing the level conversion speed.

Meanwhile, when the above-described current shutoff control during the non-operating state of the op-amps is exerted, there is a risk of an indeterminable level of outputs out1 and /out1 from the op-amps. The reason of this risk is as follows. When the current flow through the op-amps is shut off, the voltage at the node set at a high level (Vamp) gradually falls and eventually the high level (Vamp) potential of the outputs out1 and /out 1 becomes indeterminate. When the high level of either output out1 or /out1 from the op-amps falls, this affects the output from the conventional level converter and results in a leakage current flowing through the following stages of inverters. To avoid this, the leak protection circuit LPC must be provided.

For example, it is conceivable to form the leak protection circuit by inserting two NMOS transistors between nodes n2502 and n2503. In this embodiment, the gate of one MOS transistor is connected to the node nd2502 and its drain is connected the node nd2503. The drain of the other MOS transistor is connected to the node nd2502 and its gate is connected to the node nd2503. In this configuration, the voltage level at the nodes nd2502 and nd2503 is completely fixed to VDDQ or VSSQ. This leak protection circuit enables the conventional level converter to keep its output at a determinate level even if the signal level input to the converter falls from the high level (Vamp), thus eliminating the risk of a leak occurring in the following stages of inverters.

This leak protection circuit may be realized by using the corresponding circuit included in any of Embodiments 1 to 9. Even if the small amplitude power supply voltage for determining logic is lower than 1 V, the level converter implementation according to Embodiment 13 is able to amplify and convert the input signal to a signal with greater amplitude for determining logic. Its additional advantage is that, because differential amplifiers are used to amplify the input signal, stable level conversion can be performed for low voltage.

Figure 26:
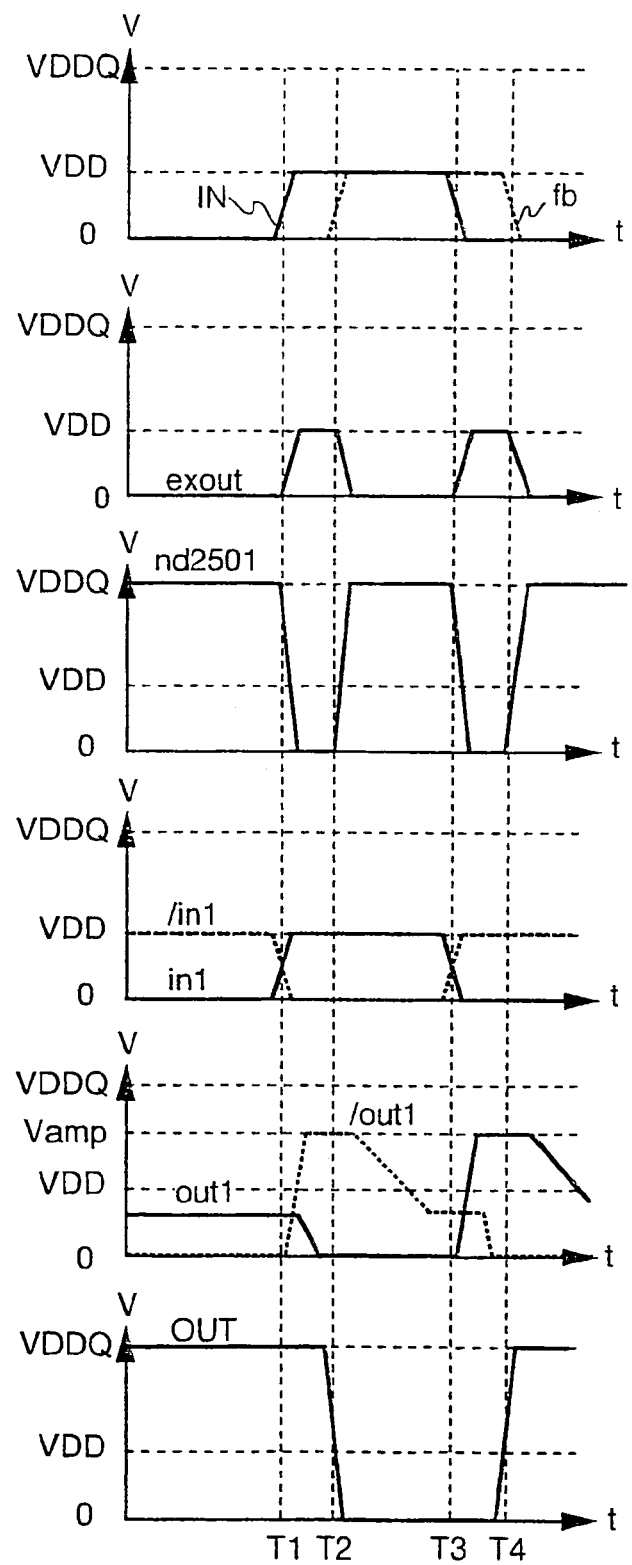
FIG. 26 shows voltage waveforms explaining the operation of the level converter embodiment of FIG. 25.

FIG. 26 shows voltage waveforms explaining the operation of the circuitry shown in FIG. 25. First, input signal transition (level shift) from low (0 V) to high (VDD) level (at time T1) will be explained. Immediately after the state of the input signal IN shifts from low (0 V) to high (VDD) level, the state of the feedback signal fb remains unchanged. Accordingly, just after time T1, the input signal IN is high (VDD) and the feedback output signal fb is low (0 V), and therefore, the exclusive OR circuit output exout turns high (VDD).

When the exclusive OR circuit output exout turns high (VDD), the node connected to the gates of the MOS transistors for current control in the op-amps (that is, node nd2501) is set low (0 V) and the op-amps are activated. When the op-amps are activated, the op-amps sense the potential difference between the input complementary signals in1 and /in1 and output out1 that shifts to its low level (0 V) and /out1 that shifts to its high level (Vamp). These output complementary signals out1 and /out1 are then input to the conventional level converter and the converter outputs an OUT signal whose voltage level shifts. When the logic of the output signal OUT has been determined (at time T2), the output fb of the level-down converter also changes from low (0 V) to high (VDD) level. Because the input signal IN level is high, the output exout of the exclusive OR circuit changes to low level (0 V). When this output exout turns low (0 V), the node (nd2501) connected to the gates of the MOS transistors for current control in the op-amps is set high (VDDQ) and the current flow through the op-amps is shut off. When the current flow through the op-amps is shut off, the high level (Vamp) of the outputs out1 and /out1 from the op-amps (only out1 shown in FIG. 26) gradually falls. However, because the leak protection circuit is provided as described for FIG. 25, the OUT signal output from the level converter can hold the determinate logic.

Then, input IN signal transition (level shift) from high (VDD) to low (0 V) level (around time T3) will be explained. Immediately after the state of the input signal IN shifts from high (VDD) to low (0 V) level, the state of the feedback signal fb remains unchanged also in this case. Accordingly, just after time T3, the input signal IN is low (0 V) and the feedback output signal fb is high (VDD), and therefore, the output exout of the exclusive OR circuit turns high (VDD).

When the exclusive OR circuit output exout turns high (VDD), the node (nd2501) connected to the gates of the MOS transistors for current control in the op-amps is set low (0 V) and the op-amps are activated. When the op-amps are activated, the op-amps sense the potential difference between the input complementary signals in1 and /in1 and output out1 that shifts to its high level (Vamp) and /out1 that shifts to its low level (0 V). These complementary signals out1 and /out1 are then input to the conventional level converter and the converter outputs an OUT signal whose voltage level shifts. When the logic of the output signal OUT has been determined (at time T4), the output fb of the level-down converter also changes from high (VDD) to low (0 V) level. Because the input signal IN level is low (0 V), the output exout of the exclusive OR circuit changes to low level (0 V). When this output exout turns low (0 V), the node (nd2501) connected to the gates of the MOS transistors for current control in the op-amps is set high (VDDQ) and the current flow through the op-amps is shut off. When the current flow through the op-amps is shut off, the high level (Vamp) of the outputs out1 and /out1 from the op-amps (only out1 shown in FIG. 26) gradually falls also in this case. However, because the leak protection circuit is provided as described for FIG. 25, the OUT signal output from the level converter can hold the determinate logic.

A feature of Embodiment 13 is the simplest circuitry of voltage amplifiers using NMOS transistors and its benefit is that design cost can be reduced.

<Embodiment 14>

Figure 27:
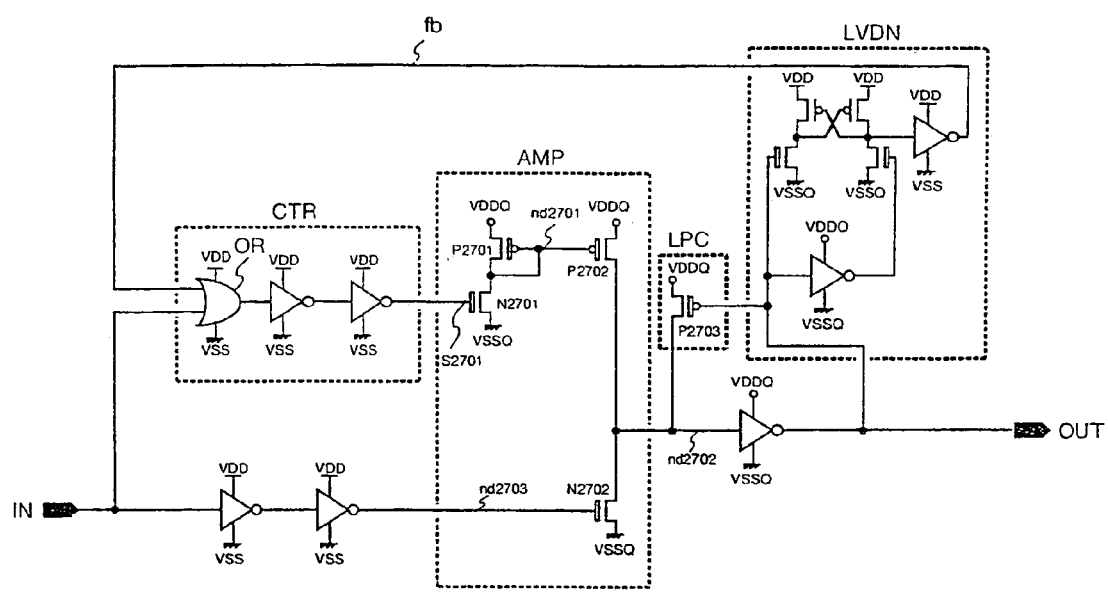
FIG. 27 is a circuit diagram illustrating a still further embodiment of the level converter using voltage amplifiers.

FIG. 27 shows a still further level converter embodiment (Embodiment 14) which uses only a single voltage amplifier for converting an input signal to output signal. This level converter circuitry is comprised of a voltage amplification unit AMP which amplifies the input signal by a voltage amplifier, a leak protection circuit LPC which holds a voltage level determined after the input signal is converted and prevents a leak in the following stages of inverters, a level-down converter LVDN for output signal feedback, and a control circuit CTR for amplification control.

The AMP shown in FIG. 27 is configured, using an NMOS transistor N2702 of simplest structure. Amplification is implemented by discharging a node nd2702 that has been precharged at VDDQ beforehand by switching of the above NMOS transistor, thus bringing the node nd2702 to the low level (0 V).

As means for precharging the node nd2702, a current mirror structure is used in this embodiment. Precharge is performed when the input is low (0 V). At this time, an NMOS transistor N2701 turns on and therefore a node nd2702 turns low (0 V). With the NMOS transistor N2702 being off, a PMOS transistor P2702 turns on, and therefore, the node nd2702 is precharged to the high level (VDDQ). Discharge is performed when the input is high (VDD). At this time, the NMOS transistor N2702 turns off and the node nd2701 turns high (VDDQ), and therefore, the PMOS transistor P2701 turns off, while the NMOS transistor turns on. Thus, the node nd2702 is discharged and brought to the low level (0 V).

Meanwhile, although current is not consumed during discharge because the PMOS transistor P2702 turns off, current always flow during precharge because the PMOS transistor P2701 and the NMOS transistor N2701 are on. This is undesirable in view of reduction of current consumption. Thus, control is incorporated in the present embodiment to turn the NMOS transistor N2701 off at the end of precharge of the node nd2702. This control is implemented by the level-down converter LVDN, leak protection circuit, and control circuit CTR in combination.

To the control circuit CTR, a feedback signal fb an and an input signal IN are input. The feedback signal is a VDD-amplitude signal to which an output signal OUT with the amplitude of VDDQ has been converted by the level-down converter. When the input is low and the feedback signal fb is low, 0 V, the control circuit makes precharge begin to invert the logic of the output OUT and the feedback signal fb. In response to change to high level (VDD) of the feedback signal fb, the control circuit makes the precharge terminate. This control is realized by a two-inputs logical sum circuit OR to which the input signal IN and feedback signal fb are input.

When the input signal is high (VDD), the output of the logical sum circuit OR is high (VDD), and therefore, the node nd2702 is discharged and brought to the low level (0 V), while the feedback signal fb turns low (0 V). When the input signal turns low (0 V), the low input signal IN (0 V) and low feedback signal fb (0 V) are input to the logical sum circuit, and therefore, its output becomes high (VDD) and the NMOS transistor N2701 turns on. Thus, precharge is performed. At the completion of precharge, the node nd2702 becomes high (VDDQ) and a PMOS transistor P2703 in the leak protection circuit LPC turns on, keeping the node nd2702 high (VDDQ). At this time, the feedback signal fb shifts to high level (VDD) in response to the level shift of the output signal OUT. Consequently, to the logical sum circuit (OR) in the control circuit, the low input signal IN (0 V) and high feedback signal fb (VDD) are input. Thus, its output becomes low (0V) and the NMOS transistor N2701 turns off. At this time, the voltage level at the node nd2701 becomes indeterminate. However, because the leak protection circuit LPC keeps the node nd 2702 high (VDDQ), no leakage current occurs in the following stages of inverters.

Figure 28:
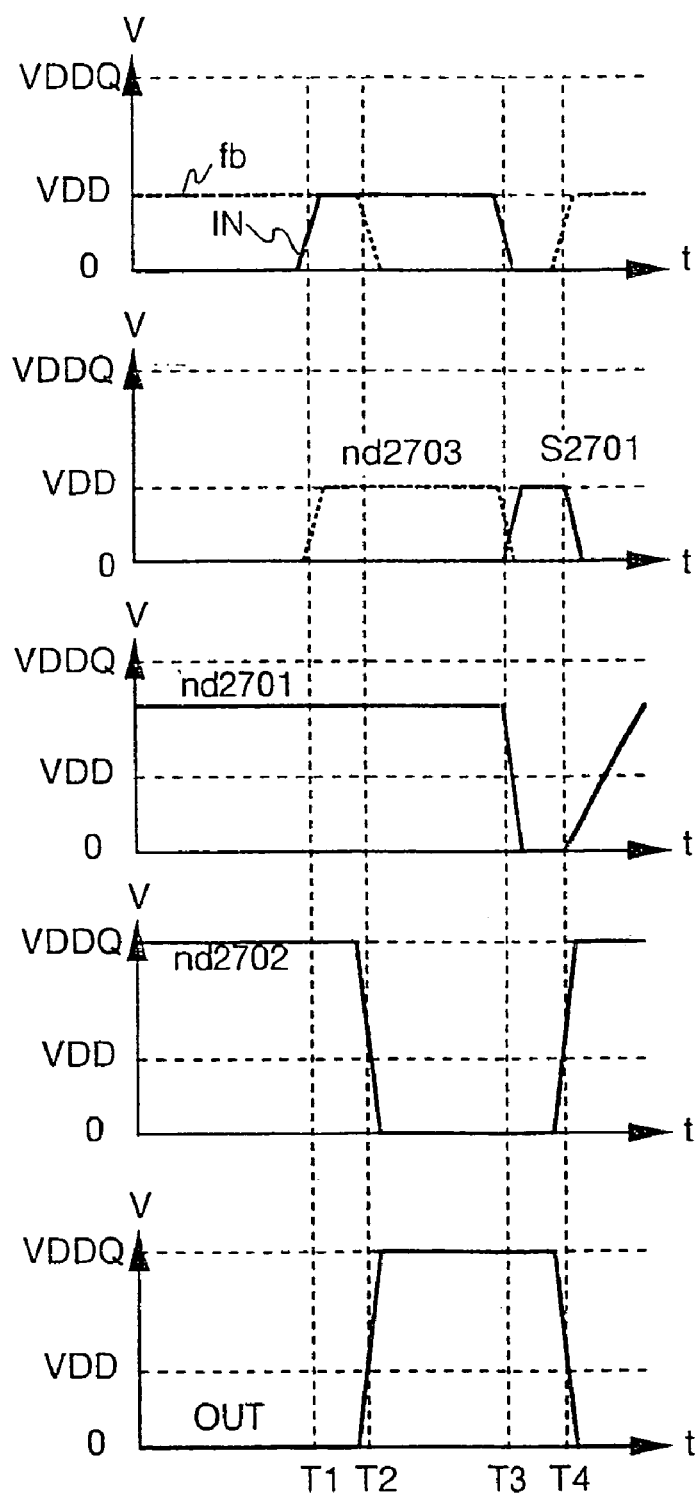
FIG. 28 shows voltage waveforms explaining the operation of the level converter embodiment of FIG. 27.

FIG. 28 shows voltage waveforms explaining the operation of the circuitry shown in FIG. 27. First, when the input signal IN shifts from low (0 V) to high (VDD) level, the voltage at the node nd2703 also shifts from low (0 V) to high (VDD) level. This turns the NMOS transistor N2702 on, and therefore, the voltage level of the node nd2702 precharged at VDDQ turns low (0 V). Consequently, the output signal shifts from low (0 V) to high (VDDQ) level. In response to the shift from low (0 V) to high (VDDQ) level of the output signal, the feedback signal fb shifts from high (VDD) to low level (0 V). During this state transition, the output of the logical sum circuit OR remains low (0 V). Thus, the node nd2701 stays at an intermediate level.

Then, when the input signal IN shifts from high (VDD) to low (0 V) level, the output of the logical sum circuit OR shifts to the high level (VDD) which turns the NMOS transistor N2701 on. Consequently, the node nd2701 turns low (0 V). In response to the change to the low level (0 V) of the node nd2701, the PMOS transistor P2702 turns on, and therefore, the node nd2702 turns high (VDDQ). Consequently, the output OUT shifts from high (VDDQ) to low (0 V) level, and therefore, the feedback signal fb shifts from low (0 V) to high (VDD) level. In response to this shift of the feedback signal fb, the output of the logical sum circuit OR shifts from low (0 V) to high (VDD) level which turns the NMOS transistor on. Consequently, the node nd2701 returns to the intermediate level. At this time, the leak protection circuit LPC brings the node nd2702 up to the high level (VDDQ), and thus, the output signal is unchanged.

INDUSTRIAL APPLICABILITY

According to the present invention, a semiconductor device including a level converter that is capable of high-speed level conversion even if the low supply voltage for its power supply is below 1 V is realized. The semiconductor device of the present invention is capable of leak prevention by internal autonomous control without using external signals, which makes it easy to design level converter circuitry; otherwise, leakage current would occur when the low voltage power supply is turned off and the circuit driven by it is placed in sleep mode.

What is claimed is:

1. A semiconductor device comprising:
a first circuit which operates on a first voltage of power supply and outputs a first signal with the amplitude of the first voltage of power supply;
a second circuit which operates on a second voltage of power supply with a magnitude greater than the first voltage of power supply; and
a level converter which converts said first signal to a second signal with the amplitude of said second voltage of power supply, and outputs the second signal to said second circuit,
said level converter includes a sense amplifier, a differential pair of signal input nodes connected to said sense amplifier, a first capacitor, a second capacitor, a first analog switch, and a second analog switch,
wherein one end of said first capacitor is connected to one of said differential pair of signal input nodes,
other end of said first capacitor is connected to an output of said first analog switch,
one end of said second capacitor is connected to other one of said differential pair of signal input nodes,
other end of said second capacitor is connected to an output of said second analog switch,
at precharge state, each of other ends of said first and said second capacitors are precharged to the first voltage of power supply and said differential pair of signal input nodes are precharged to said second voltage of power supply,
after said precharge state, said first signal is inputted to other end of said first capacitor through said first analog switch and the second signal which is a complimentary signal of said first signal is inputted to other end of said second capacitor through said second analog switch by switching on said first and second analog switches, and said sense amplifier amplifies a voltage difference of said differential pair of signal input nodes.

2. A semiconductor device according to claim 1, further comprising a latch circuit which operates on said second voltage of power supply, wherein said latch circuit holds an output of said sense amplifier.

3. A semiconductor device according to claim 2, wherein said first and second capacitors are MOS capacitors, said output of said sense amplifier is inputted to said latch circuit through a third analog switch to said latch circuit, said first analog switch and said second analog switch are controlled by a first clock signal, and said third analog switch is controlled by a second clock signal.

* * * * *